US011825725B2

(12) United States Patent
An et al.

(10) Patent No.: US 11,825,725 B2
(45) Date of Patent: Nov. 21, 2023

(54) DISPLAY PANEL INCLUDING VERNIER MARK FOR ALIGNING CONDUCTIVE ADHESIVE MEMBER, ELECTRONIC APPARATUS INCLUDING THE SAME, AND METHOD OF MANUFACTURING THE ELECTRONIC APPARATUS

(71) Applicant: Samsung Display Co., Ltd., Yongin-si (KR)

(72) Inventors: Jun-yong An, Anseong-si (KR); Yun-kyeong In, Hwaseong-si (KR); Junwon Choi, Hwaseong-si (KR); Wonmi Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/815,132

(22) Filed: Jul. 26, 2022

(65) Prior Publication Data

US 2022/0367578 A1    Nov. 17, 2022

Related U.S. Application Data

(63) Continuation of application No. 16/434,032, filed on Jun. 6, 2019, now Pat. No. 11,437,441.

(30) Foreign Application Priority Data

Jun. 22, 2018 (KR) .................. 10-2018-0071858

(51) Int. Cl.
*H10K 59/88* (2023.01)
*H01L 23/544* (2006.01)
(Continued)

(52) U.S. Cl.
CPC ........... *H10K 59/88* (2023.02); *H01L 23/544* (2013.01); *H10K 59/131* (2023.02);
(Continued)

(58) Field of Classification Search
CPC ............... H01L 23/544; H01L 27/3223; H01L 27/3276; H01L 2223/54406;
(Continued)

(56) References Cited

U.S. PATENT DOCUMENTS 6,198,519 B1 * 3/2001 Chang .................... H05K 3/361
29/830
10,091,876 B2   10/2018 Kim et al.
(Continued)

FOREIGN PATENT DOCUMENTS

CN         1409283 A      4/2003
CN       107479272 A     12/2017
(Continued)

OTHER PUBLICATIONS

EPO Extended Search Report dated Nov. 26, 2019, for corresponding European Patent Application No. 19178696.1, (7 pages).

*Primary Examiner* — Matthew E. Gordon
(74) *Attorney, Agent, or Firm* — Lewis Roca Rothgerber Christie LLP

(57) ABSTRACT

An electronic apparatus includes a display panel including a base substrate including an active area and a peripheral area adjacent to the active area, pixels on the active area, pads on the peripheral area and arranged in a first direction, signal lines connecting the pixels to the pads, and a vernier mark on the peripheral area and spaced apart from the pads and the signal lines, a circuit board on the display panel and including a base film, and leads on the base film and overlapping with the pads in a plan view, and a conductive adhesive member extending in the first direction and between the display panel and the circuit board to connect the pads to the leads. The conductive adhesive member overlaps with the vernier mark when viewed in a second direction intersecting the first direction.

15 Claims, 34 Drawing Sheets

(51) Int. Cl.
*H10K 59/131* (2023.01)
*H10K 59/12* (2023.01)

(52) U.S. Cl.
CPC .............. *H01L 2223/54406* (2013.01); *H01L 2223/54426* (2013.01); *H10K 59/1201* (2023.02)

(58) Field of Classification Search
CPC .......... H01L 2223/54426; H10K 59/00; H10K 59/12; H10K 59/1201; H10K 59/131; H10K 59/88
USPC .......................................................... 257/72
See application file for complete search history.

(56) References Cited

U.S. PATENT DOCUMENTS

| | | | |
|---|---|---|---|
| 10,410,987 | B2 | 9/2019 | Kim et al. |
| 2002/0130984 | A1* | 9/2002 | Watanabe ............. G02F 1/1345 349/58 |
| 2003/0053056 | A1 | 3/2003 | Ohazama |
| 2007/0052344 | A1 | 3/2007 | Wen et al. |
| 2008/0101048 | A1* | 5/2008 | Mishiro ................. H05K 3/361 29/830 |
| 2017/0357122 | A1* | 12/2017 | Oh ........................ G02F 1/1341 |
| 2018/0113545 | A1 | 4/2018 | Shim et al. |
| 2019/0131359 | A1 | 5/2019 | Kong |

FOREIGN PATENT DOCUMENTS

| | | |
|---|---|---|
| CN | 107801300 A | 3/2018 |
| CN | 107977109 A | 5/2018 |
| JP | 2003-223115 A | 8/2003 |
| JP | 2003-258396 A | 9/2003 |
| JP | 2003-302652 A | 10/2003 |
| JP | 2006-19391 A | 1/2006 |
| JP | 2010-145772 A | 7/2010 |
| KR | 10-2007-0013834 A | 1/2007 |
| KR | 10-2008-0046352 A | 5/2008 |
| KR | 10-1182559 B1 | 10/2012 |
| KR | 10-2013-0112258 A | 10/2013 |
| KR | 10-2017-0014424 A | 2/2017 |
| KR | 10-2018-0015331 A | 2/2018 |
| KR | 10-2018-0044491 A | 5/2018 |
| WO | WO 2012/093468 A1 | 7/2012 |

* cited by examiner

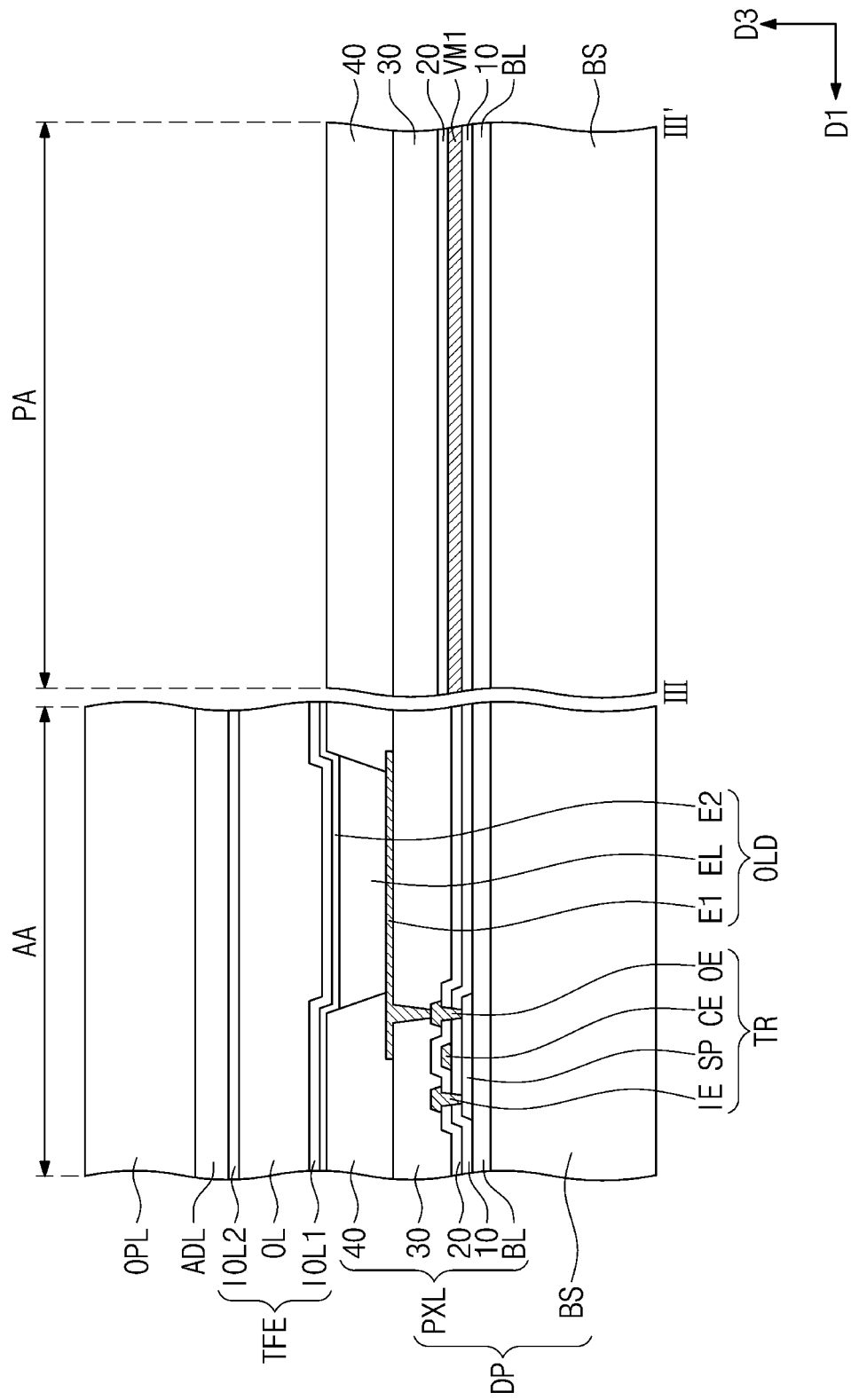

DISPLAY PANEL INCLUDING VERNIER MARK FOR ALIGNING CONDUCTIVE ADHESIVE MEMBER, ELECTRONIC APPARATUS INCLUDING THE SAME, AND METHOD OF MANUFACTURING THE ELECTRONIC APPARATUS

CROSS-REFERENCE TO RELATED APPLICATION

This application is a continuation of U.S. patent application Ser. No. 16/434,032, dated Jun. 6, 2019, which claims priority to and the benefit of Korean Patent Application No. 10-2018-0071858, filed on Jun. 22, 2018, the entire contents of which are hereby incorporated by reference.

BACKGROUND

1. Field

Embodiments of the present disclosure herein relate to a display panel, an electronic apparatus including the same, and a method of manufacturing the electronic apparatus, and for example, to a display panel capable of improving process reliability, an electronic apparatus including the same, and a method of manufacturing the electronic apparatus.

2. Description of the Related Art

An electronic apparatus may include two or more electronic components. For example, an electronic apparatus such as a portable phone, a notebook computer, or a television may include a display panel configured to display an image, and a circuit board.

Two electronic components may be electrically connected to each other through connection of pads. The two electronic components may be physically and electrically coupled to each other through a conductive adhesive member. After aligning the conductive adhesive member with the pads, the two electronic components may be coupled to each other by a thermal compression tool.

A process error such as misalignment may occur at the two electronic components by vibration of the two electronic components and/or manufacturing apparatuses. Thus, connection reliability of the electronic components may be deteriorated.

SUMMARY

The present disclosure may provide a display panel capable of improving reliability in a manufacturing process, an electronic apparatus including the same, and a method of manufacturing the electronic apparatus.

In an embodiment of the present disclosure, an electronic apparatus includes a display panel including a base substrate including an active area and a peripheral area adjacent to the active area, a plurality of pixels on the active area, a plurality of pads on the peripheral area and arranged in a first direction, a plurality of signal lines connecting the pixels to the pads, and a vernier mark on the peripheral area and spaced apart from the pads and the signal lines, a circuit board on the display panel and including a base film and leads on the base film and overlapping with the pads in a plan view, and a conductive adhesive member extending in the first direction and between the display panel and the circuit board to connect the pads to the leads. The conductive adhesive member overlaps with the vernier mark when viewed in a second direction intersecting the first direction.

In an embodiment, a bottom end of the vernier mark may be aligned with top ends of the pads in the first direction when viewed in a plan view.

In an embodiment, a top end of the conductive adhesive member may be aligned with the bottom end of the vernier mark in the first direction when viewed in a plan view.

In an embodiment, the conductive adhesive member may overlap with a portion of the vernier mark when viewed in a plan view.

In an embodiment, the circuit board may overlap with a portion of the vernier mark when viewed in a plan view.

In an embodiment, the vernier mark may include a conductive material or a semiconductor material.

In an embodiment, the pixel may include a thin film transistor including a control electrode, a semiconductor pattern, an input electrode, and an output electrode, and a light emitting element connected to the thin film transistor and including a first electrode, a second electrode, and an emission layer between the first electrode and the second electrode. The vernier mark may be on the same layer as at least one selected from the control electrode, the semiconductor pattern, the input electrode, the output electrode, and the first electrode.

In an embodiment, the vernier mark may include a first pattern, and a second pattern on the first pattern, an insulating layer being interposed therebetween to intersect the first pattern. The second pattern may penetrate the insulating layer so as to be connected to the first pattern.

In an embodiment, the vernier mark may be on a single layer to have a single unitary body shape.

In an embodiment, the vernier mark may include a plurality of line patterns arranged in the second direction and extending in the first direction. At least one or some of the line patterns may be exposed from the conductive adhesive member.

In an embodiment, the vernier mark may further include a vertical pattern extending in the second direction and intersecting the line patterns.

In an embodiment, the vernier mark may further include a horizontal pattern extending in the first direction and between the line patterns, and a length of the horizontal pattern may be less than a length of each of the line patterns.

In an embodiment, the vernier mark may have an Arabic numeral shape when viewed in a plan view.

In an embodiment, the vernier mark may be spaced apart from the signal lines when viewed in a plan view.

In an embodiment, the display panel may further include a panel alignment mark spaced apart from the pads and overlapping with the conductive adhesive member in a plan view, and the circuit board may further include a board alignment mark corresponding to the panel alignment mark and overlapping with the conductive adhesive member in a plan view. A left end of the vernier mark may be aligned with a right end of the panel alignment mark when viewed in the second direction.

In an embodiment, a distance from top ends of the pads to a top end of the conductive adhesive member in the second direction may be less than 100 μm when viewed in a plan view.

In an embodiment of the present disclosure, a display panel includes a base substrate including an active area and a peripheral area adjacent to the active area, a plurality of pixels on the active area of the base substrate, a plurality of signal lines connected to the pixels, a plurality of pads that are on the peripheral area, are arranged in a first direction, and are connected to the signal lines, and a vernier mark that is on the peripheral area, is spaced apart from the pads, and includes at least one selected from a conductive material and a semiconductor material. A bottom end of the vernier mark may be aligned with top ends of the pads in the first direction when viewed in a plan view.

In an embodiment, each of the pixels may include a thin film transistor including a semiconductor pattern, an input electrode and an output electrode connected to one side and another side of the semiconductor pattern, respectively, and a control electrode overlapping with the semiconductor pattern, and a light emitting element connected to the thin film transistor and including a first electrode, a second electrode on the first electrode, and an emission layer between the first electrode and the second electrode. The vernier mark may include the same material as at least one selected from the semiconductor pattern, the input electrode, the output electrode, the control electrode, and the first electrode.

In an embodiment, the vernier mark may be on the same layer as at least one selected from the semiconductor pattern, the input electrode, the output electrode, the control electrode, and the first electrode.

In an embodiment, the vernier mark may include a plurality of line patterns extending in the first direction and arranged in a second direction intersecting the first direction.

In an embodiment, the vernier mark may further include a vertical pattern that extends in the second direction, intersects the line patterns, and is connected to the line patterns.

In an embodiment, the line patterns and the vertical pattern may be on the same layer.

In an embodiment, the line patterns and the vertical pattern may be on different layers, an insulating layer being interposed therebetween, and the vertical pattern may penetrate the insulating layer so as to be connected to the line patterns.

In an embodiment, a distance between the line patterns adjacent to each other may be about 50 μm.

In an embodiment, the vernier mark may be spaced apart from the pads and the signal lines when viewed in a plan view.

In an embodiment, each of the pads may extend in a direction inclined with respect to the first direction when viewed in a plan view.

In an embodiment of the present disclosure, a method of manufacturing an electronic apparatus may include aligning a conductive adhesive member extending in one direction on pads of a display panel, performing a first bonding process to press the conductive adhesive member, aligning a circuit board on the conductive adhesive member, and performing a second bonding process to press the circuit board and the pads. The aligning of the conductive adhesive member may include aligning a position of the conductive adhesive member based on a vernier mark of the display panel that is spaced apart from the pads.

In an embodiment, the aligning of the position of the conductive adhesive member may include checking an overlapping degree of the vernier mark and the conductive adhesive member. The checking of the overlapping degree of the vernier mark and the conductive adhesive member may be performed using a naked eye or a loupe.

In an embodiment, the method may further include correcting a position of the conductive adhesive member. The correcting of the position of the conductive adhesive member may include checking an overlapping degree between the vernier mark and the conductive adhesive member, and moving a relative position of the conductive adhesive member with respect to the display panel when the overlapping degree is beyond a set or predetermined range.

In an embodiment, the moving of the relative position of the conductive adhesive member may include moving the conductive adhesive member in a direction intersecting the one direction.

In an embodiment, the correcting of the position of the conductive adhesive member may be performed before the aligning of the circuit board.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of embodiments of the present disclosure. In the drawings:

FIGS. 7A-7B are cross-sectional views illustrating portions of electronic apparatuses according to some embodiments of the present disclosure;

DETAILED DESCRIPTION

Figure 1A:
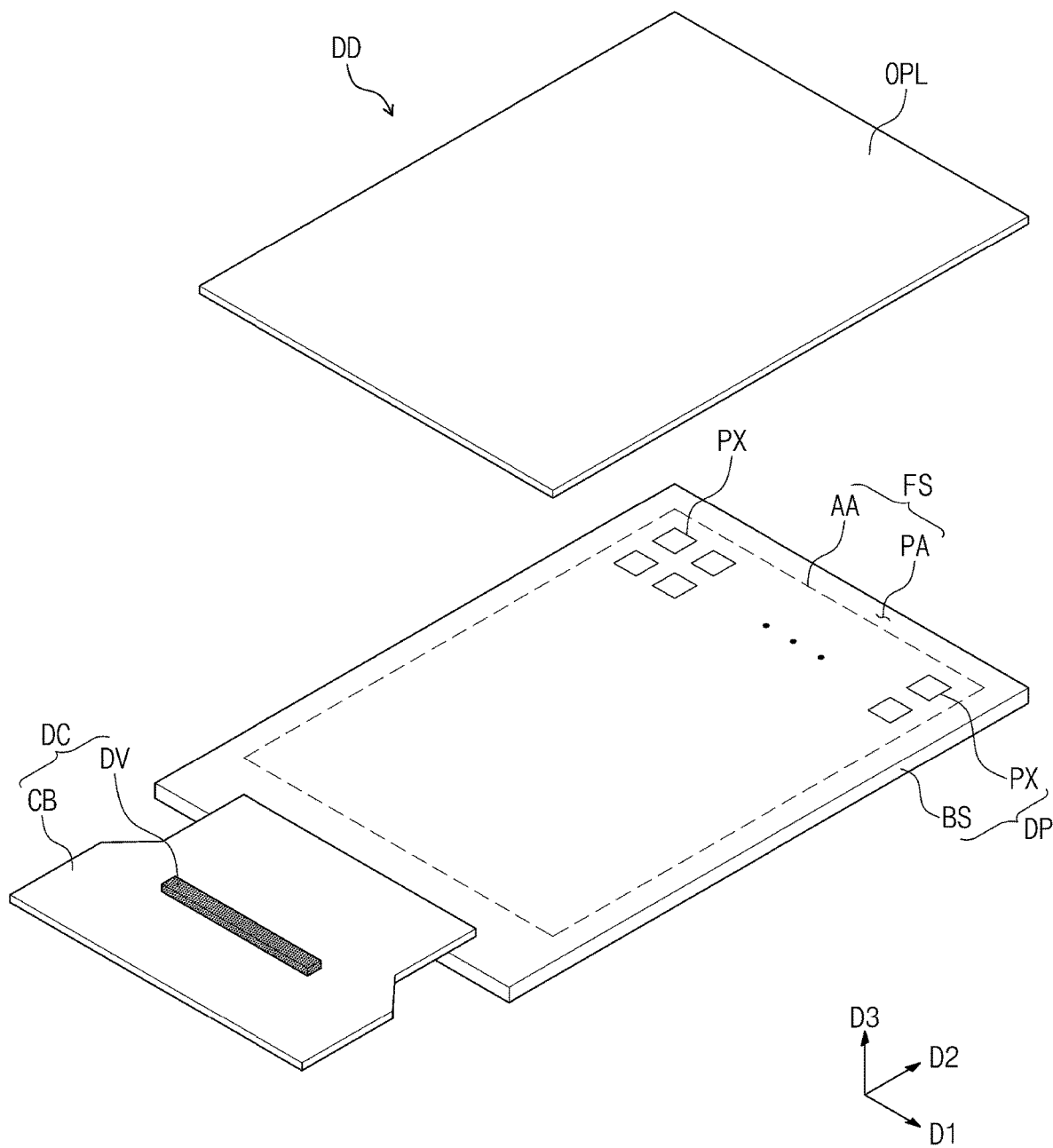
FIG. 1A is an exploded perspective view illustrating an electronic apparatus according to an embodiment of the present disclosure.

The subject matter of the present disclosure will now be described more fully hereinafter with reference to the accompanying drawings, in which various embodiments are shown. The subject matter of the present disclosure may, however, be embodied in many different forms, and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout.

It will be understood that when an element such as a layer, region or substrate is referred to as being "on" another element, it can be directly on the other element or intervening elements may be present. In contrast, the term "directly on" means that there are no intervening elements between the element and the other element. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the spirit and scope of the present disclosure.

The terms "about" and "approximately," as used herein, are inclusive of the stated value and means within an acceptable range of deviation for the particular value as determined by one of ordinary skill in the art, considering the measurement in question and the error associated with measurement of the particular quantity (e.g., the limitations of the measurement system).

Exemplary embodiments are described herein with reference to cross-sectional illustrations and/or plane illustrations that may be idealized exemplary illustrations. In the drawings, the thicknesses of layers and regions may be exaggerated for clarity. Accordingly, variations from the shapes of the illustrations as a result, for example, of manufacturing techniques and/or tolerances, may be expected. Thus, the embodiments described herein should not be construed as limited to the shapes of regions illustrated herein but are to include deviations in shapes that result, for example, from manufacturing. For example, an etching region illustrated as a rectangle may have rounded or curved features. Thus, the regions illustrated in the figures may be schematic in nature and their shapes are not necessarily intended to illustrate the actual shape of a region of a device and are not intended to limit the scope of the embodiments described herein.

Hereinafter, exemplary embodiments of the present disclosure will be described in more detail with reference to the accompanying drawings.

Figure 1B:
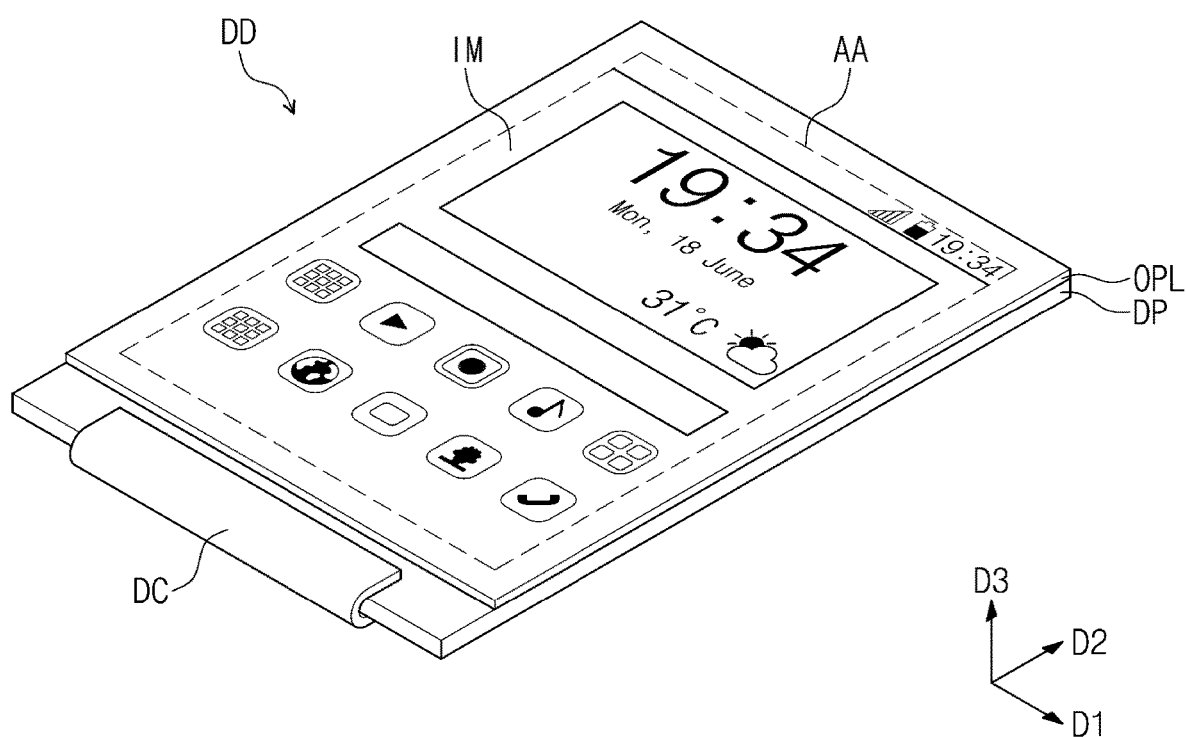
FIG. 1B is a combined perspective view illustrating the electronic apparatus of FIG. 1A.
Figure 1C:
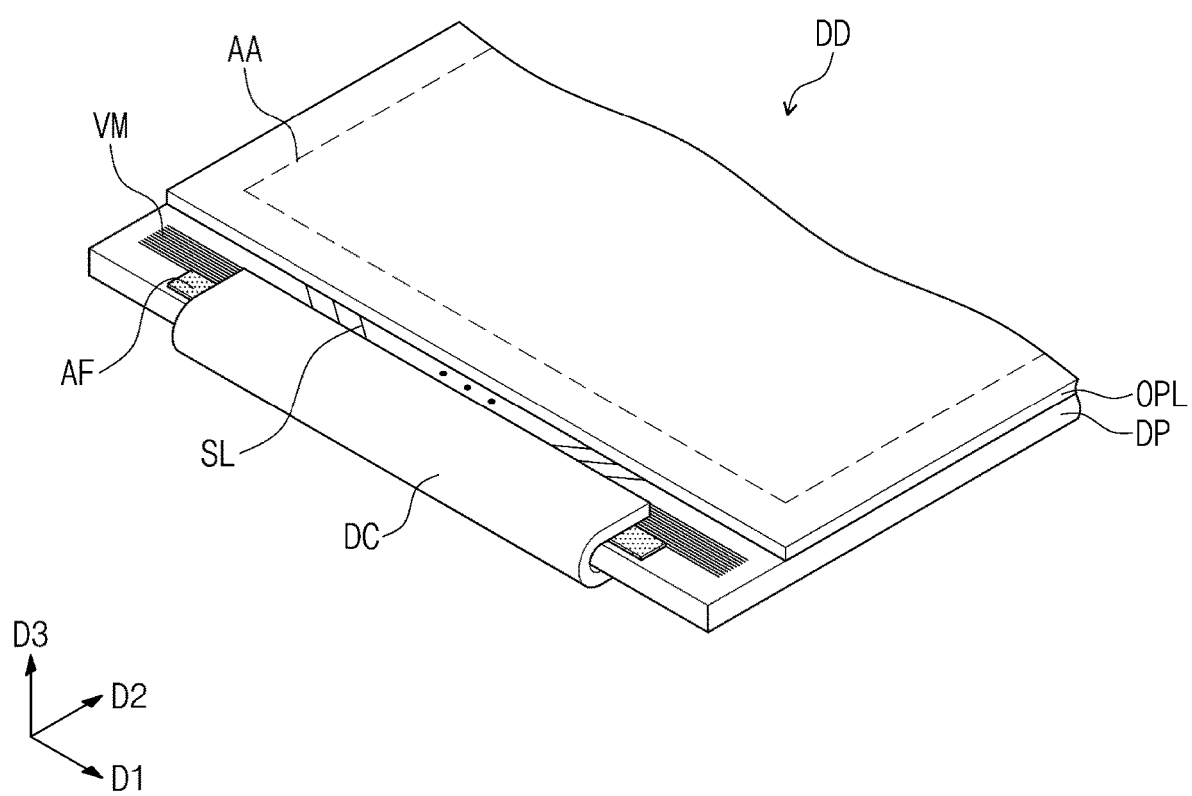
FIG. 1C is a perspective view illustrating a portion of the electronic apparatus of FIG. 1B.
Figure 1D:
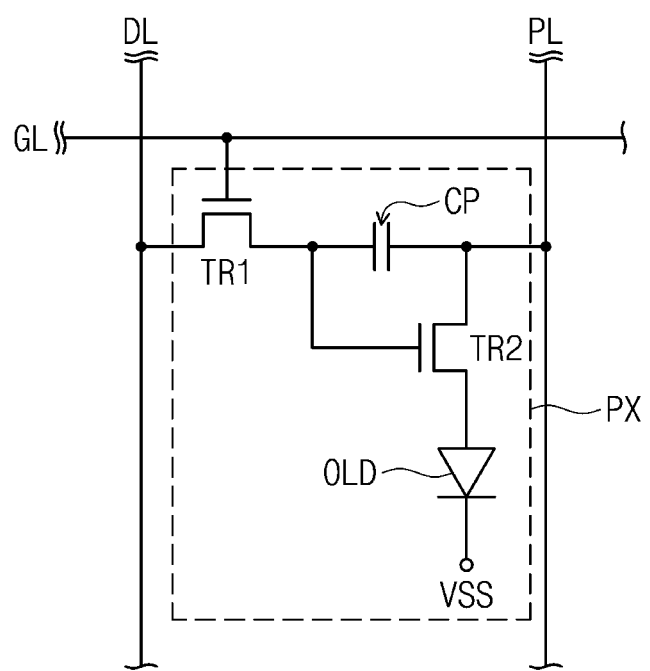
FIG. 1D is a circuit diagram of a component of the electronic apparatus of FIG. 1A.

FIG. 1A is an exploded perspective view illustrating an electronic apparatus according to an embodiment of the present disclosure. FIG. 1B is a combined perspective view illustrating the electronic apparatus of FIG. 1A. FIG. 1C is a perspective view illustrating a portion of the electronic apparatus of FIG. 1B. FIG. 1D is a circuit diagram of a component of the electronic apparatus of FIG. 1A. Hereinafter, an embodiment of the present disclosure will be described with reference to FIGS. 1A-1D.

An electronic apparatus DD may include a display panel DP, a circuit board DC, a conductive adhesive member AF, and an optical member OPL. The display panel DP may include a base substrate BS and may display an image through a front surface FS of the base substrate BS. The front surface FS may be parallel (e.g., substantially parallel) to a first direction D1 and a second direction D2 and may be perpendicular (e.g., substantially perpendicular) to a third direction D3. The front surface FS may include an active area AA on which an image is displayed, and a peripheral area PA adjacent to the active area AA. In the present embodiment, the peripheral area PA may have a frame shape that surrounds an edge of the active area AA. However, embodiments of the present disclosure are not limited thereto. In another embodiment, the peripheral area PA may be adjacent to a portion of the edge of the active area AA.

The display panel DP may include a plurality of pixels PX disposed on the active area AA. In the present embodiment, each of the pixels PX may receive an electrical signal to display or emit light forming an image. In FIG. 1A, the pixels PX are illustrated to correspond to light emitting areas displaying light, respectively. Thus, the pixels PX are spaced apart from each other. However, embodiments of the present disclosure are not limited thereto. In another embodiment, some components of the pixels PX may overlap with each other when viewed in a plan view.

FIG. 1D schematically illustrates a circuit diagram including a pixel PX and signal lines connected to the pixel PX. One pixel PX may be connected to one gate line GL, one data line DL, and one power line PL. Signal lines SL may include at least one selected from the gate line GL, the data line DL, and the power line PL.

The gate line GL may extend in the first direction D1. The gate line GL may transmit a gate signal to the pixel PX. The gate line GL may be provided in plurality, and the plurality of gate lines GL may be spaced apart from each other and may be arranged in the second direction D2. The plurality of gate lines may sequentially provide gate signals to the pixels arranged in the second direction D2.

The data line DL may be insulated from the gate line GL and may intersect the gate line GL. In the present embodiment, the data line DL may extend in the second direction D2. The data line DL may transmit a data signal to the pixel PX. The data line DL may be provided in plurality, and the plurality of data lines DL may be spaced apart from each other and may be arranged in the first direction D1.

The power line PL may be insulated from the gate line GL and the data line DL. In the present embodiment, the power line PL may extend in the second direction D2. The power line PL may transmit a first power source signal to the pixel PX. The power line PL may be provided in plurality, and the plurality of power lines PL may be spaced apart from each other and may be arranged in the first direction D1.

The pixel PX may include a first transistor TR1, a second transistor TR2, a capacitor CP, and a light emitting element OLD. The first transistor TR1 may be turned-on by the gate signal provided through the gate line GL and may provide the data signal provided through the data line DL to the capacitor CP.

The capacitor CP may store a voltage corresponding to a potential difference between the data signal and the first power source signal provided from the power line PL. The second transistor TR2 may be turned-on by the voltage stored in the capacitor CP and may provide the first power source signal provided from the power line PL to the light emitting element OLD.

In the present embodiment, the light emitting element OLD may be connected to a power source terminal VSS and may receive a second power source signal from the power source terminal VSS. A potential of the second power source signal may be different from a potential of the first power source signal. The light emitting element OLD may generate and emit light corresponding to a potential difference between the first power source signal provided from the second transistor TR2 and the second power source signal provided from the power source terminal VSS.

The circuit board DC may be disposed at one side of the display panel DP and may be electrically connected to the display panel DP. The circuit board DC may generate an electrical signal and may provide the generated electrical signal to the display panel DP, and/or the circuit board DC may receive an electrical signal generated from the display panel DP and may process the received electrical signal.

Electrical signals generated from the circuit board DC may be provided to the pixels PX through the signal lines SL of the display panel DP. The signal lines SL may include at least one selected from the power line PL, the gate line GL, and the data line DL.

The circuit board DC may include a flexible film CB and a driving circuit DV. The flexible film CB may be adhered directly to the display panel DP through the conductive adhesive member AF. The flexible film CB may have flexibility. Thus, the flexible film CB may be assembled with the display panel DP in a state in which a portion of the flexible film CB is bent toward a rear surface of the display panel DP.

The driving circuit DV may be mounted on the flexible film CB. The driving circuit DV may be electrically connected to the flexible film CB through circuit lines included in the flexible film CB. The flexible film CB may electrically connect the driving circuit DV to the display panel DP, and the driving circuit DV may generate an electrical signal provided to the display panel DP and/or may process an electrical signal provided from the display panel DP.

The driving circuit DV may include a gate driving circuit for generating gate signals or a data driving circuit for generating data signals. However, embodiments of the present disclosure are not limited thereto. In certain embodiments, the driving circuit DV may include various suitable control circuits for generating and processing various control signals used to drive the display panel DP.

The conductive adhesive member AF may be disposed between the circuit board DC and the display panel DP to couple the circuit board DC and the display panel DP to each other. The conductive adhesive member AF may have both conductivity and adhesion. Thus, the conductive adhesive member AF may physically and electrically couple the circuit board DC and the display panel DP to each other. The conductive adhesive member AF may include an anisotropic conductive adhesive film (ACF).

The conductive adhesive member AF may extend in a direction intersecting the signal lines SL. In the present embodiment, the conductive adhesive member AF may have a shape extending in the first direction D1 and having a length in the first direction D1. In an embodiment, a portion of the conductive adhesive member AF may protrude outside the flexible film CB. In other words, the length of the conductive adhesive member AF in the first direction D1 may be equal to or greater than a width of the flexible film CB in the first direction D1 on the display panel DP. Thus, an end of the conductive adhesive member AF may be aligned with a corner or edge of the flexible film CB, or a portion of the conductive adhesive member AF may be exposed from the flexible film CB.

The optical member OPL may be disposed on the display panel DP. The optical member OPL may cover the active area AA. The optical member OPL may be optically transparent. Thus, an image IM displayed on the active area AA may be transmitted through the optical member OPL. The image IM displayed by the display panel DP may be transmitted through the optical member OPL so as to be displayed on a top surface of the optical member OPL, and thus, a user may easily view the image IM.

The optical member OPL may further cover at least a portion of the peripheral area PA. The optical member OPL may reduce a reflectance of external light. The optical member OPL may reduce an incidence rate of external light on a front surface of the display panel DP and/or may reduce a transmittance of reflected light when external light is incident through the optical member OPL and then is reflected from components of the display panel DP toward the optical member OPL. For example, the optical member OPL may include at least one selected from of a polarizing film and a phase retardation film. However, embodiments of the present disclosure are not limited thereto. In certain embodiments, the optical member OPL may include a color filter. In an embodiment, the optical member OPL may be adhered to the front surface of the display panel DP through an adhesive member or may be formed directly on the front surface of the display panel DP.

On the other hand, the display panel DP according to the present embodiment may include a vernier mark VM. The vernier mark VM may be disposed on the peripheral area PA. The vernier mark VM may function as a reference used to check or verify whether the conductive adhesive member AF is aligned with pads PD in a plan view or not and a degree of alignment of the conductive adhesive member AF with the pads PD. The conductive adhesive member AF may be disposed adjacent to the vernier mark VM or may be disposed to overlap with a portion of the vernier mark VM. The display panel DP may be connected to the circuit board DC by electrical connection between the circuit board DC and the pads PD connected to the signal lines SL. The pads PD may exist on an area covered by the circuit board DC. The alignment between the conductive adhesive member AF and the pads PD may mean that overlapping areas between the conductive adhesive member AF and the pads PD in a plan view are great.

Connection between the circuit board DC and the signal lines SL may be made by the alignment between the conductive adhesive member AF and the pads PD and alignment between the circuit board DC and the conductive adhesive member AF.

According to embodiments of the present disclosure, the degree of the alignment between the conductive adhesive member AF and the pads PD may be checked or verified by a degree of adjacency/overlap between the conductive adhesive member AF and the vernier mark VM. Thus, the degree of the alignment between the conductive adhesive member AF and the pads PD may be easily checked or verified without an additional fine measuring apparatus such as a vision camera or a scope.

Figure 2A:
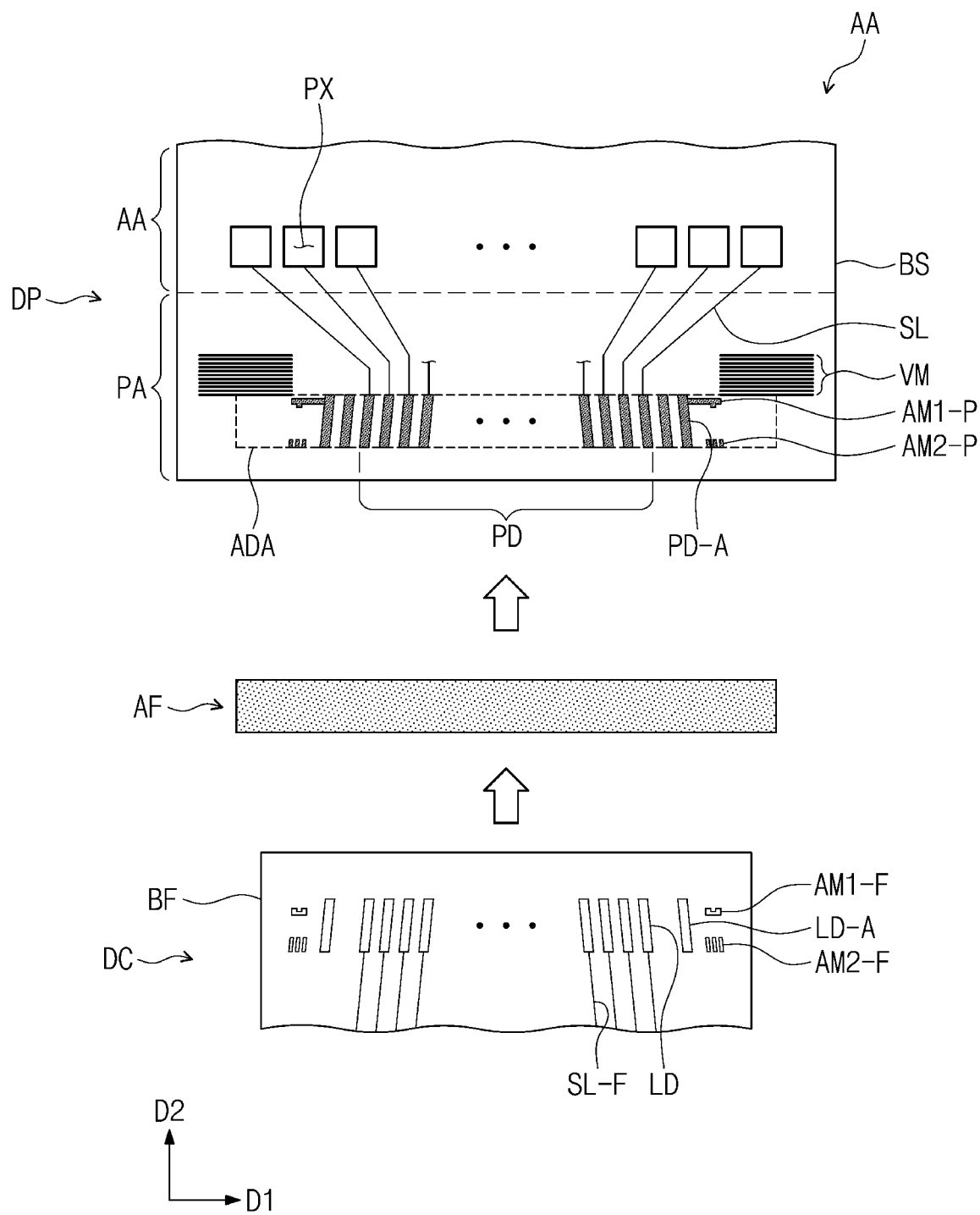
FIG. 2A is an exploded plan view illustrating the electronic apparatus of FIG. 1B.
Figure 2B:
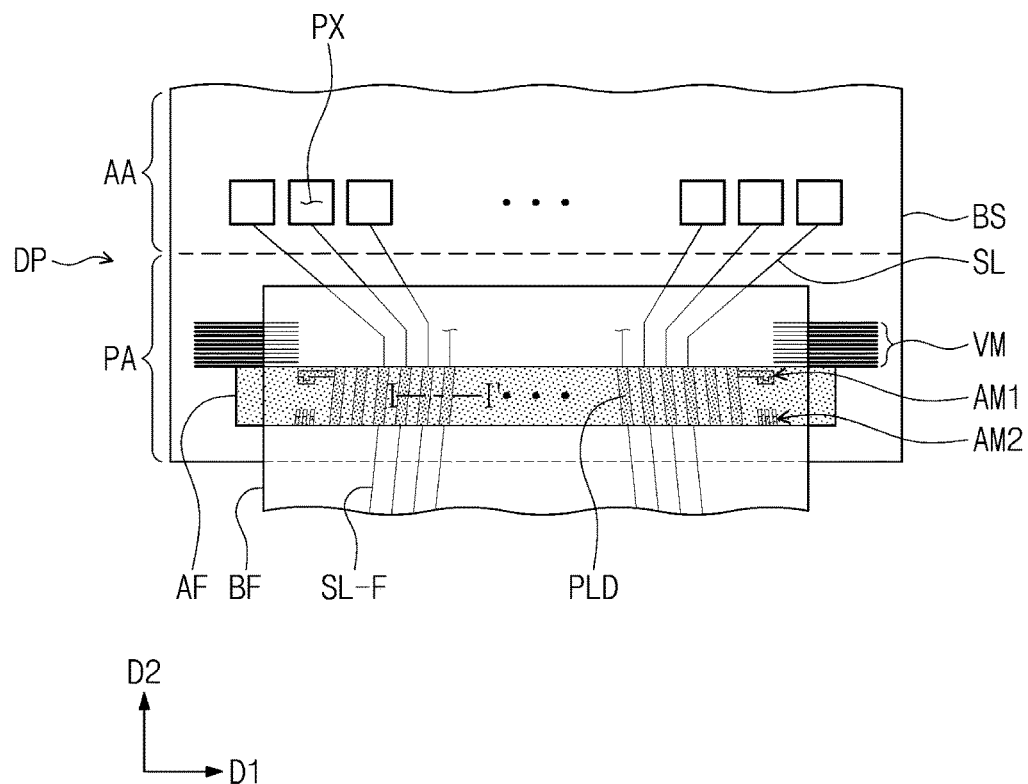
FIG. 2B is a combined plan view illustrating the electronic apparatus of FIG. 2A.
Figure 2C:
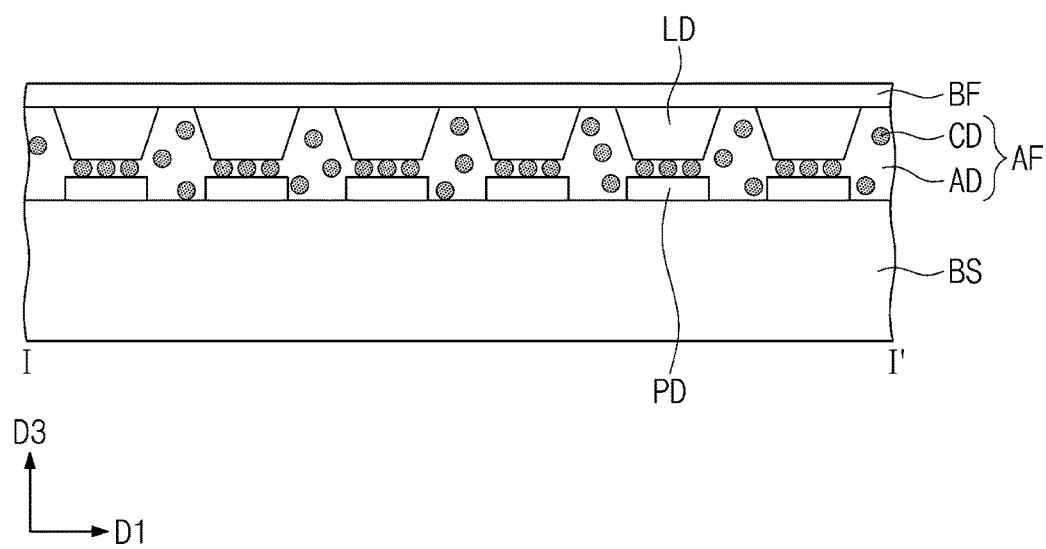
FIG. 2C is a cross-sectional view taken along a line I-I' of FIG. 2B.
Figure 3:
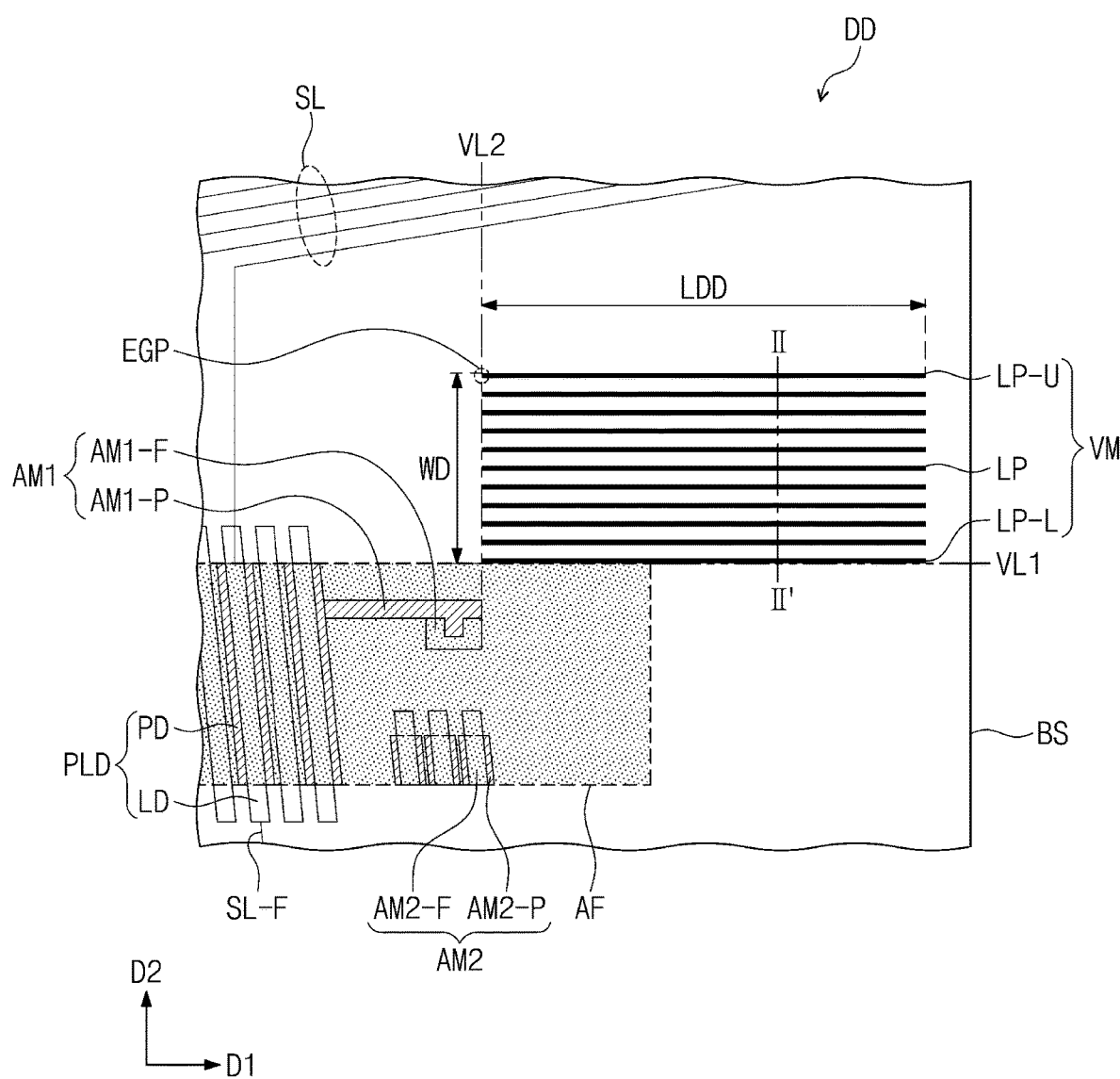
FIG. 3 is an enlarged plan view illustrating a portion of the electronic apparatus of FIG. 2B.

FIG. 2A is an exploded plan view illustrating the electronic apparatus of FIG. 1B, and FIG. 2B is a combined plan view illustrating the electronic apparatus of FIG. 2A. FIG. 2C is a cross-sectional view taken along a line I-I' of FIG. 2B. FIG. 3 is an enlarged plan view illustrating a portion of the electronic apparatus of FIG. 2B. In FIG. 3, an area on which the vernier mark VM exists is illustrated, a base film BF of the circuit board DC is omitted, and the conductive adhesive member AF is shaded. Hereinafter, an embodiment of the present disclosure will be described with reference to FIGS. 2A-2C and 3. In addition, the same components as described with reference to FIGS. 1A-1D will be indicated by the same reference designators, and the descriptions thereto will be omitted for the purpose of ease and convenience in description.

As illustrated in FIG. 2A, the display panel DP may include the base substrate BS, the pixels PX, the signal lines SL, the pads PD, an alignment pad PD-A, a first alignment mark AM1-P, a second alignment mark AM2-P, and the vernier mark VM. The base substrate BS may be a substrate including the active area AA and the peripheral area PA and may be a base layer on which the pixels PX, the signal lines SL, the pads PD, the alignment pad PD-A, the first alignment mark AM1-P, the second alignment mark AM2-P, and the vernier mark VM are disposed. The base substrate BS may have an insulating property.

In the present embodiment, some of the pixels PX, some of the signal lines SL, and some of the pads PD are illustrated for the purpose of ease and convenience in description and illustration. In FIGS. 2A-2B, the signal lines SL may connect the pads PD to the pixels PX, respectively. Thus, electrical signals received from the pads PD may be transmitted to the pixels PX through the signal lines SL, respectively. In the present embodiment, the pads PD may extend in a direction inclined with respect to the first direction D1 and the second direction D2.

The alignment pad PD-A may be spaced apart from the pads PD in the first direction D1. The alignment pad PD-A may have a shape corresponding to a shape of at least one of the pads PD. The alignment pad PD-A may be a floating pattern. Thus, even though the alignment pad PD-A is connected to the circuit board DC or an electrical signal is transmitted to the alignment pad PD-A, the electrical signal may not be provided to the pixels PX. However, embodiments of the present disclosure are not limited thereto. In another embodiment, the alignment pad PD-A may be an inspection pad used to inspect electrical characteristics of the display panel DP. In this case, the alignment pad PD-A may be electrically connected to at least one of the pixels PX but may not be connected to the circuit board DC. In an embodiment, the alignment pad PD-A may be omitted from the display panel DP.

The first alignment mark AM1-P and the second alignment mark AM2-P may be used as a reference for the alignment between the display panel DP and the circuit board DC. The first alignment mark AM1-P and the second alignment mark AM2-P may be electrically insulated from the pixels PX. In the present embodiment, the first alignment mark AM1-P is adjacent to the alignment pad PD-A, and the second alignment mark AM2-P is spaced apart from the alignment pad PD-A. In addition, the first alignment mark AM1-P and the second alignment mark AM2-P have different shapes from each other. However, embodiments of the present disclosure are not limited thereto. In certain embodiments, the first alignment mark AM1-P and the second alignment mark AM2-P may be provided at various suitable positions in the display panel DP and may have various suitable shapes.

The vernier mark VM may be disposed on the peripheral area PA and may be spaced apart from the pads PD, the signal lines SL, the alignment pad PD-A, the first alignment mark AM1-P, and the second alignment mark AM2-P when viewed in a plan view. In the present embodiment, the vernier mark VM may be provided in plurality, and the plurality of vernier marks VM may be spaced apart from each other in the first direction D1 with the pads PD interposed therebetween when viewed in the second direction D2. The vernier mark VM may be used as a reference for the alignment between the conductive adhesive member AF and the pads PD. For example, in the display panel DP according to an embodiment of the present disclosure, an adhesion area ADA on which the conductive adhesive member AF is disposed may be defined such that a top end of the adhesion area ADA meets a bottom end of the vernier mark VM when viewed in a plan view. This will be described herein below in more detail.

The flexible film CB may include a base film BF, a plurality of interconnection lines SL-F, a plurality of leads LD, an alignment lead LD-A, a third alignment mark AM1-F, and a fourth alignment mark AM2-F. The base film BF may have flexibility and may have an insulating property. Thus, the flexible film CB may be bent in a state in which it is coupled to the display panel DP.

The leads LD, the alignment lead LD-A, the third alignment mark AM1-F, and the fourth alignment mark AM2-F may be disposed on one surface of the base film BF. The leads LD may be connected to the display panel DP. The leads LD may be spaced apart from each other in the first direction D1 and may provide independent electrical signals of each other. In the present embodiment, the leads LD may extend in a direction inclined with respect to the first direction D1 and the second direction D2. The leads LD may have shapes substantially corresponding to those of the pads PD.

The base film BF of the circuit board DC and/or the base substrate BS of the display panel DP may be thermally deformed by heat generated in a process of connecting the circuit board DC and the display panel DP to each other. Thus, in the process, a pitch of the pads PD and/or a pitch of the leads LD may be changed differently from designed values. However, according to embodiments of the present disclosure, the leads LD and the pads PD may be designed to have the shapes extending in the inclined direction. Thus, even though the pitch of the leads LD and/or the pitch of the pads PD is changed, alignment between the pads PD and the leads LD may be easily corrected by moving a position of the circuit board DC in the second direction D2.

The alignment lead LD-A may be spaced apart from the leads LD when viewed in a plan view. The alignment lead LD-A may be spaced apart from the leads LD in the first direction D1. The alignment lead LD-A may have a shape corresponding to a shape of at least one of the leads LD. The alignment lead LD-A may be a floating pattern. Thus, even though the alignment lead LD-A is connected to the display panel DP or an electrical signal is transmitted to the alignment lead LD-A, the electrical signal may not be provided to the pixels PX. However, embodiments of the present disclosure are not limited thereto. In another embodiment, the alignment lead LD-A may be an inspection lead used to inspect electrical characteristics of the circuit board DC. In an embodiment, the alignment lead LD-A may be omitted from the circuit board DC.

The third alignment mark AM1-F and the fourth alignment mark AM2-F may be used as a reference for the alignment between the display panel DP and the circuit board DC. The third alignment mark AM1-F and the fourth alignment mark AM2-F may be electrically insulated from the leads LD. In the present embodiment, the third alignment mark AM1-F may correspond to the first alignment mark AM1-P of the display panel DP, and the fourth alignment mark AM2-F may correspond to the second alignment mark AM2-P of the display panel DP. The third alignment mark AM1-F and the fourth alignment mark AM2-F may be aligned with the first alignment mark AM1-P and the second alignment mark AM2-P of the display panel DP, respectively, and thus, the circuit board DC may be easily aligned with the display panel DP.

In the present embodiment, the third alignment mark AM1-F and the fourth alignment mark AM2-F have different shapes from each other. However, embodiments of the present disclosure are not limited thereto. In certain embodiments, the third alignment mark AM1-F and the fourth alignment mark AM2-F may be provided at various suitable positions in the circuit board DC and may have various suitable shapes.

The interconnection lines SL-F may be disposed on the one surface of the base film BF. One end of each of the interconnection lines SL-F may be connected to each of the leads LD. Another end of each of the interconnection lines SL-F may be connected to the driving circuit DV (see FIG. 1A). Thus, electrical signals processed in the driving circuit DV may be outputted to the leads LD through the interconnection lines SL-F.

The conductive adhesive member AF and the flexible film CB may be sequentially stacked on the pads PD along an arrow direction illustrated in FIG. 2A. The conductive adhesive member AF may be provided on the adhesion area ADA of the display panel DP, and then, the circuit board DC may be provided on the conductive adhesive member AF in such a way that the first alignment mark AM1-P and the second alignment mark AM2-P of the display panel DP are aligned with the third alignment mark AM1-F and the fourth alignment mark AM2-F of the circuit board DC. Thereafter, the display panel DP and the circuit board DC may be coupled to each other through the conductive adhesive member AF. Referring to FIG. 2B and FIG. 3, the circuit board DC and the display panel DP may be aligned with each other in such a way that the first and third alignment marks AM1-P and AM1-F form a first alignment pattern AM1 and the second and fourth alignment marks AM2-P and AM2-F form a second alignment pattern AM2, and then, the circuit board DC may be coupled to the display panel DP.

The pads PD may overlap with the leads LD when viewed in a plan view. In the present embodiment, the pads PD are hatched to easily distinguish the pads PD from the leads LD. Each of the pads PD may be coupled to a corresponding one of the leads LD. The pad PD and the lead LD coupled in parallel to each other are illustrated as one connection pattern PLD.

According to an embodiment of the present disclosure, the leads LD and the pads PD may be designed such that lengths of the leads LD in the second direction D2 are greater than lengths of the pads PD in the second direction D2. Thus, even though the circuit board DC is moved with respect to the display panel DP in the second direction D2 in a process tolerance, the circuit board DC and the display panel DP may be stably connected to each other. However, embodiments of the present disclosure are not limited thereto. In other embodiments, the lengths of the leads LD may be substantially equal to or less than the lengths of the pads PD.

Referring to FIG. 2C, the leads LD may be connected to the pads PD through the conductive adhesive member AF. In the present embodiment, the pads PD disposed on one surface of the base substrate BS and the leads LD disposed on one surface of the base film BF are illustrated for the purpose of ease and convenience in description. However, embodiments of the present disclosure are not limited thereto. In other embodiments, at least one insulating layer may be disposed between the base substrate BS and the pads PD, and/or at least one insulating layer may be disposed between the base film BF and the leads LD.

In the present embodiment, the conductive adhesive member AF may have the length in the first direction D1 and a width in the second direction D2. The length of the conductive adhesive member AF may be capable of covering the pads PD, the alignment pads PD-A, the first alignment pattern AM1, and the second alignment pattern AM2. In addition, the width of the conductive adhesive member AF may be capable of covering at least the pads PD. Thus, the conductive adhesive member AF may fully cover at least the pads PD. As a result, reliability of electrical connection between the circuit board DC and the display panel DP may be improved.

The conductive adhesive member AF may include an adhesive layer AD and a plurality of conductive particles CD. The conductive particles CD may be dispersed in the adhesive layer AD. The leads LD may be disposed on the pads PD, respectively. The leads LD may be physically coupled to the pads PD through the adhesive layer AD. In addition, the leads LD may be electrically coupled to the pads PD through the conductive particles CD disposed between the leads LD and the pads PD. In the present embodiment, the leads LD may completely overlap with the pads PD, respectively, when viewed in a cross-sectional view. However, embodiments of the present disclosure are not limited thereto. In certain embodiments, an area in which leads partially non-overlap with corresponding pads may exist by an error occurring in designing and/or vibration occurring in the first direction D1 in a coupling or bonding process.

The vernier mark VM and the conductive adhesive member AF will be described in more detail with reference to FIG. 2B and FIG. 3. According to an embodiment of the present disclosure, a position of the conductive adhesive member AF may be determined based on the vernier mark VM. The vernier mark VM may be defined in an area which has a rectangular shape having a transverse length LDD measured in the first direction D1 and a longitudinal length measured in the second direction D2. The vernier mark VM may be spaced apart from the pads PD, the alignment pads PD-A, the alignment marks AM1-P and AM2-P, and the signal lines SL when viewed in a plan view. In other words, in the present embodiment, the vernier mark VM may not overlap with the pads PD, the alignment pads PD-A, the alignment marks AM1-P and AM2-P, and the signal lines SL when viewed in a plan view. Thus, the vernier mark VM may be free from electrical interference with the pads PD, the alignment pads PD-A, the alignment marks AM1-P and AM2-P, and the signal lines SL, which are adjacent to the vernier mark VM.

A shape of the vernier mark VM may be variously modified or changed in an area spaced apart from adjacent components. In the present embodiment, the vernier mark VM may include a plurality of line patterns LP. Each of the line patterns LP may have a line shape extending in parallel (e.g., substantially parallel) to the first direction D1. The line patterns LP may be spaced apart from each other in the second direction D2 and may be arranged in the second direction D2. For example, the line patterns LP may be spaced apart from each other in the second direction D2 at a uniform (e.g., substantially uniform) interval.

The line patterns LP may include a lowermost line LP-L closest to the pads PD and an uppermost line LP-U furthest from the pads PD when viewed in a plan view. The lowermost line LP-L may extend along a first imaginary line VL1. The lowermost line LP-L may overlap with the first imaginary line VL1 in a plan view. The lowermost line LP-L may be one of the line patterns LP, which is closest to the conductive adhesive member AF. The first imaginary line VL1 may extend in parallel to (e.g., substantially parallel) the first direction D1. The first imaginary line VL1 may meet top ends of the pads PD in a plan view. In other words, in the present embodiment, the lowermost line LP-L of the line patterns LP may be substantially aligned with the top ends of the pads PD along a single common imaginary line (e.g., the first imaginary line VL1).

Thus, when the conductive adhesive member AF is located to be in contact with a bottom end of the vernier mark VM, it may be evaluated that the conductive adhesive member AF is disposed at a position stably overlapping with at least the pads PD. As the position of the conductive adhesive member AF moves upward from the bottom end of the vernier mark VM along the second direction D2 in a plan view, a separation distance between a top side of the conductive adhesive member AF and the top ends of the pads PD may increase. If the separation distance is increased beyond a set or predetermined range, overlapping areas between the conductive adhesive member AF and the pads PD may be reduced to cause misalignment of the conductive adhesive member AF. Thus, connection failure between the conductive adhesive member AF and the pads PD may be easily caused. However, according to embodiments of the present disclosure, because the display panel DP further includes the vernier mark VM aligned along a second imaginary line VL2, it is possible to easily determine or check whether the conductive adhesive member AF is misaligned with the pads PD.

Ends EGP of the line patterns LP may be aligned along the second imaginary line VL2. The ends EGP of the line patterns LP may be ends closest to the pads PD. The second imaginary line VL2 may extend parallel (e.g., substantially parallel) to the second direction D2. The second imaginary line VL2 may meet an end of the first alignment mark AM1-P. In other words, in the present embodiment, the ends EGP of the line patterns LP may be substantially aligned with the end of the first alignment mark AM1-P along one common imaginary line (e.g., the second imaginary line VL2).

The transverse length LDD of the vernier mark VM may be defined as a length of each of the line patterns LP, and the longitudinal length WD of the vernier mark VM may correspond to a distance between the uppermost line LP-U and the lowermost line LP-L of the line patterns LP. In more detail, the longitudinal length WD of the vernier mark VM may correspond to a length between a point of the second imaginary line VL2 overlapping with the uppermost line LP-U and a point of the second imaginary line VL2 overlapping with the lowermost line LP-L.

In the present embodiment, the transverse length LDD may be a length which allows the conductive adhesive member AF to overlap with the vernier mark VM when viewed in the second direction D2. For example, the transverse length LDD of the vernier mark VM may be about 1200 μm. However, embodiments of the present disclosure are not limited thereto. In other embodiments, the transverse length LDD of the vernier mark VM may be variously designed depending on the position of the vernier mark VM and/or the length of the conductive adhesive member AF in the first direction D1.

According to an embodiment of the present disclosure, the separation distance from the top ends of the pads PD to a top end (e.g., the top side) of the conductive adhesive member AF (e.g., a misalignment degree of the conductive adhesive member AF with respect to the pads PD) may be measured in a range of the longitudinal length WD of the vernier mark VM. Thus, as the longitudinal length WD of the vernier mark VM increases, a range of the misalignment degree of the conductive adhesive member AF which can be determined or checked may be increased. The longitudinal length WD of the vernier mark VM may be equal to or greater than an allowable misalignment range.

For example, when the misalignment degree of the conductive adhesive member AF (e.g., the separation distance between the top end of the conductive adhesive member AF and the top ends of the pads PD) is about 100 μm or less in a good product according to an embodiment of the present disclosure, the longitudinal length WD of the vernier mark VM may be designed to be about 100 μm or more. In this case, whether the alignment degree of the conductive adhesive member AF is good may be easily determined or checked by checking whether the top end of the conductive adhesive member AF is beyond the top end (e.g., the uppermost line LP-U) of the vernier mark VM, and thus, a process time may be reduced.

On the other hand, as the longitudinal length WD of the vernier mark VM increases, a possibility that the vernier mark VM interferes with the signal lines SL or the first alignment mark AM1-P adjacent thereto may be increased. On the contrary, as the transverse length LDD of the vernier mark VM decreases, the number of the line patterns LP may be reduced or distances between the line patterns LP may be reduced. As the number of the line patterns LP is reduced, it may be difficult to check or determine a fine difference of the alignment degree. As the distances between the line patterns LP are reduced, readability of determination or check by the naked eye may be difficult. As used herein, the term "naked eye" refers to a human eye (or human vision) that is not assisted by a magnification device or apparatus, other than typical prescription eyeglasses.

According to embodiments of the present disclosure, the vernier mark VM may be designed to have a sufficient size capable of securing a sufficient number of the line patterns LP without causing interference with adjacent components and/or of maintaining distances between the line patterns LP which can easily determine or check the alignment. For example, the longitudinal length WD of the vernier mark VM according to an embodiment of the present disclosure may be about 450 µm.

However, embodiments of the present disclosure are not limited thereto. The vernier mark VM may be variously designed as long as it does not interfere with adjacent signal lines and has a position and a size which are capable of determining or checking the misalignment degree of the conductive adhesive member AF. For example, the top ends of the pads PD may not overlap with the lowermost line LP-L in the first direction D1. In this case, the conductive adhesive member AF may be disposed to overlap with a portion of the vernier mark VM when viewed in a plan view.

In an embodiment, a width of each of the line patterns LP and the distance between the line patterns LP may be variously designed. Thus, a pitch of the line patterns LP may be variously designed. As described above, as the pitch of the line patterns LP increases, the vernier mark VM may be easily observed by the naked eye in a process. Thus, the alignment degree of the conductive adhesive member AF may be checked or determined in real time through an inspection by the naked eye (e.g., an visual inspection), and thus, a process may be simplified and a process time may be reduced.

In an embodiment, as the pitch of the line patterns LP decreases, the number of the line patterns LP of the vernier mark VM in the same area may be increased. Thus, it is possible to evaluate a fine alignment degree as well as whether the conductive adhesive member AF is aligned or not. As a result, process reliability may be improved. In an embodiment, even though it is somewhat difficult to check or determine the alignment degree with the naked eye, the line patterns LP may be designed to have a pitch which can be viewed by a microscope such as a small loupe. As used herein, the term "loupe" or "small loupe" refers to a magnification device or apparatus, including but not limited to a magnifying glass and eyeglasses.

In the vernier mark VM according to an embodiment of the present disclosure, each of the line patterns LP may have a width of about 3 µm and a distance between the line patterns LP may be about 50 µm. This pitch may be checked or determined with the naked eye. In addition, designed distances between the line patterns LP of the vernier mark VM may be equal to each other. Thus, the alignment degree of the conductive adhesive member AF may be easily quantitatively checked by checking the number of the line patterns LP overlapping with the conductive adhesive member AF. However, embodiments of the present disclosure are not limited thereto. In other embodiments, the vernier mark VM may include the line patterns LP having a finer pitch or may include the line patterns LP arranged at different distances.

According to an embodiment of the present disclosure, the alignment degree of the conductive adhesive member AF may be determined depending on the number of line patterns, overlapping with the conductive adhesive member AF, of the line patterns LP of the vernier mark VM. According to an embodiment of the present disclosure, the position and/or the size of the vernier mark VM may be variously designed under the condition that the vernier mark VM checks or determines the alignment degree of the conductive adhesive member AF as well as whether the conductive adhesive member AF is aligned or not.

The vernier mark VM according to an embodiment of the present disclosure may include a conductive material or a semiconductor material. For example, the vernier mark VM may include a metal, a metal oxide, or a semiconductor material. In more detail, the vernier mark VM may include a material of which a reflectance or refractive index is different from that of an insulating layer or the base substrate BS. Thus, the vernier mark VM may be easily distinguished from an adjacent area through a loupe or the naked eye.

In the present embodiment, the circuit board DC may partially overlap with the vernier mark VM. However, embodiments of the present disclosure are not limited thereto. In other embodiments, the circuit board DC may be disposed at a position not overlapping with the vernier mark VM in a plan view or may have a size not overlapping with the vernier mark VM in a plan view.

At least a portion of the conductive adhesive member AF may protrude from the circuit board DC in the first direction D1 or a direction opposite to the first direction D1 when viewed in a plan view. This may be because the length of the conductive adhesive member AF in the first direction D1 is greater than the width of the circuit board DC in the first direction D1. The conductive adhesive member AF may have the length capable of overlapping with the vernier mark VM when viewed in the second direction D2. According to embodiments of the present disclosure, the alignment degree of the conductive adhesive member AF may be easily checked by the vernier mark VM not covered by the circuit board DC.

In an embodiment, the conductive adhesive member AF may be fully covered by the circuit board DC in a plan view. In this case, the vernier mark VM may be shifted from the illustrated position in the first direction D1 or the opposite direction so as to be closer to the signal lines SL, and thus, the vernier mark VM may be defined at a position overlapping with one or some of the pads PD when viewed in the second direction D2. The electronic apparatus according to an embodiment of the present disclosure may include the conductive adhesive member AF of which the shape and the size are variously modified under the condition that the alignment degree of the conductive adhesive member AF is checked or determined using the vernier mark VM.

Figure 4:
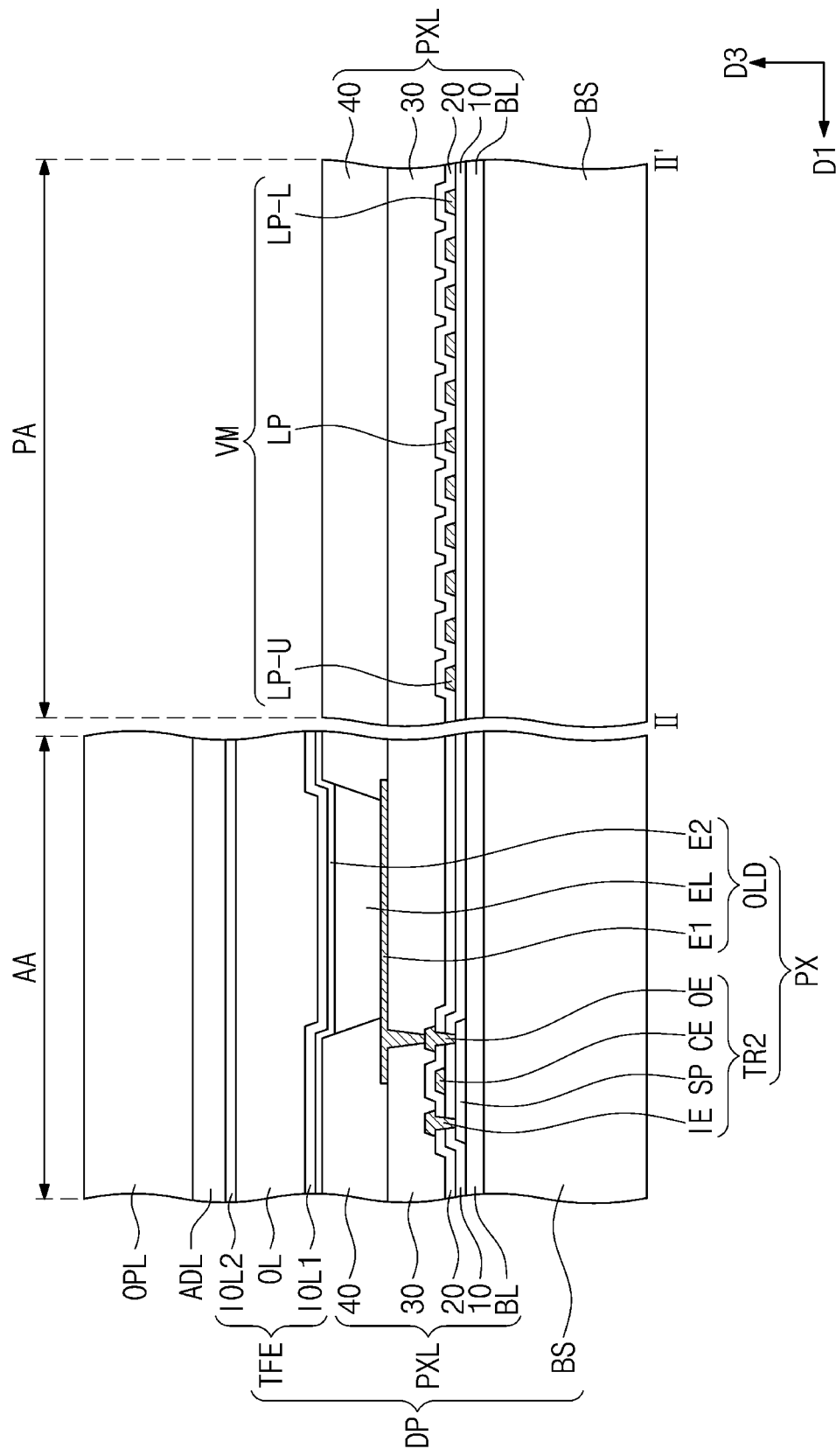
FIG. 4 is a cross-sectional view schematically illustrating a portion of an electronic apparatus according to an embodiment of the present disclosure.
Figure 5A:
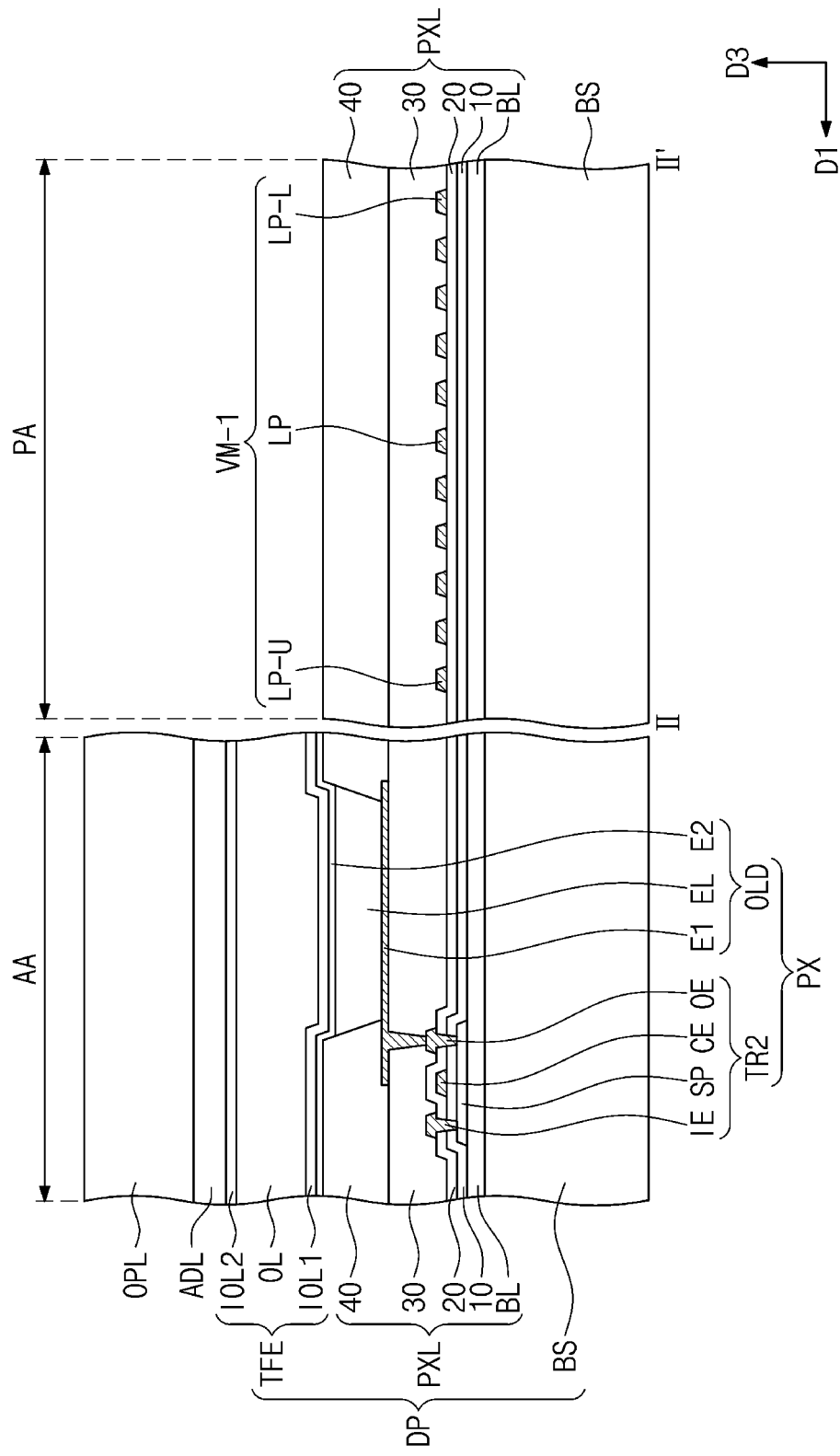
FIGS. 5A-5C are cross-sectional views schematically illustrating portions of electronic apparatuses according to some embodiments of the present disclosure.
Figure 5B:
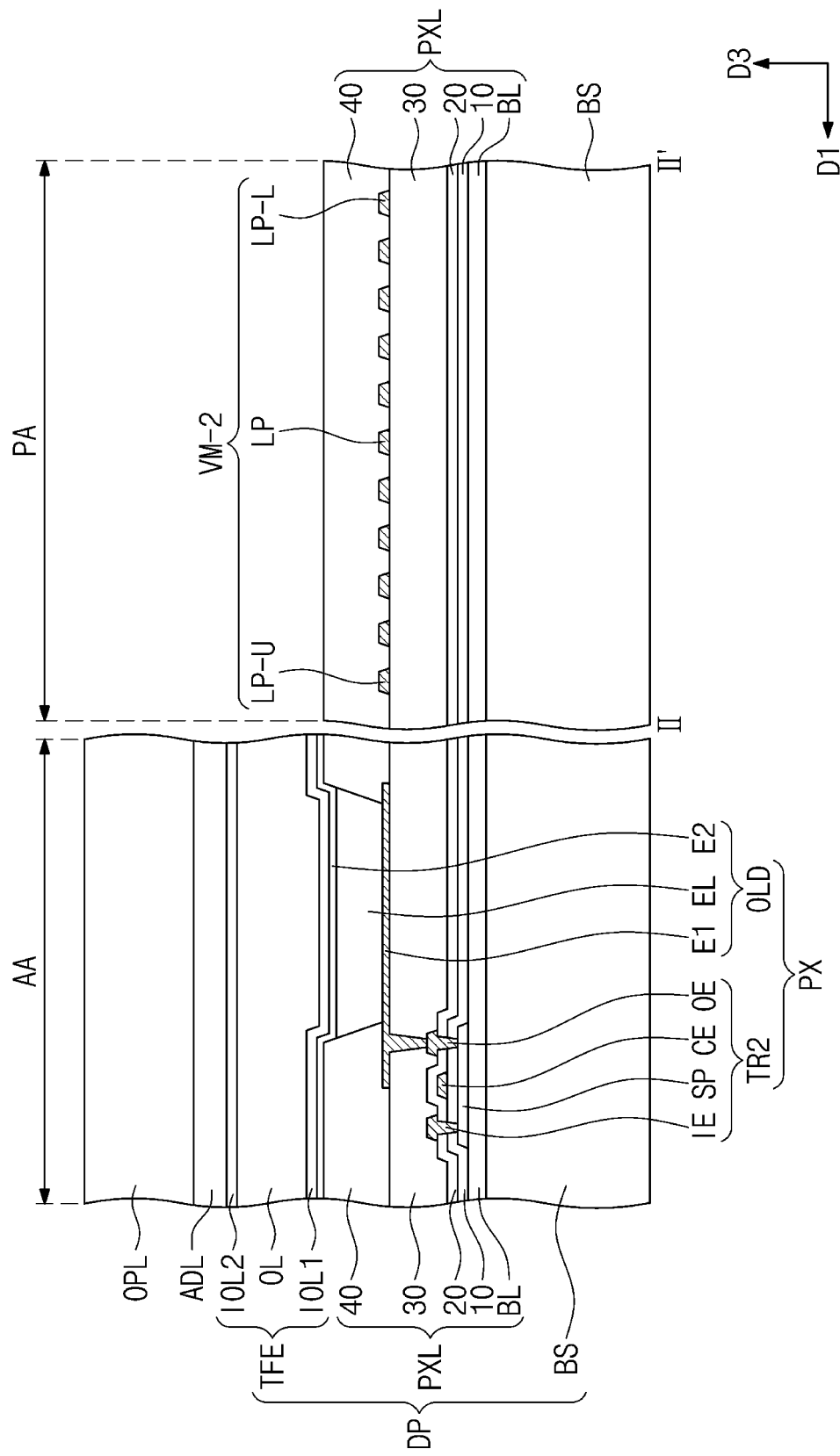
Figure 5C:
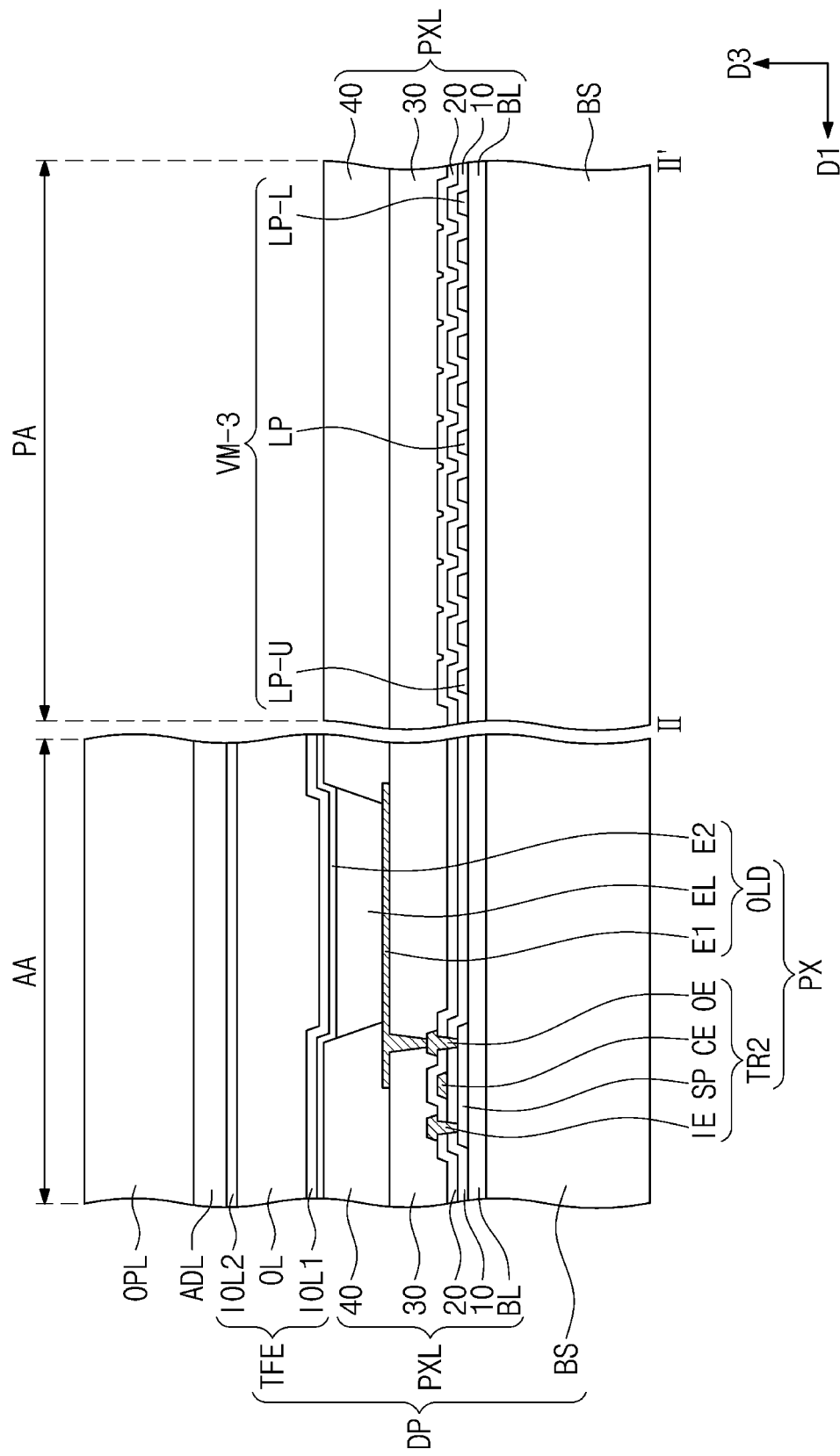

FIG. 4 is a cross-sectional view schematically illustrating a portion of an electronic apparatus according to an embodiment of the present disclosure. FIGS. 5A-5C are cross-sectional views schematically illustrating portions of electronic apparatuses according to some embodiments of the present disclosure. FIG. 4 illustrates a portion of the pixel PX and an area taken along a line II-II' of FIG. 3 for the purpose of ease and convenience in description and illustration. FIGS. 5A-5C illustrate areas corresponding to FIG. 4. Hereinafter, embodiments of the present disclosure will be described with reference to FIGS. 4-5C. In addition, the same components as described with reference to FIGS. 1A-3 will be indicated by the same reference designators, and the descriptions thereto will be omitted for the purpose of ease and convenience in description.

As illustrated in FIG. 4, the display panel DP may include the base substrate BS, a pixel layer PXL, and an encapsulation layer TFE. As described above, the base substrate BS may be a base layer on which the pixel PX and the vernier mark VM are disposed. The base substrate BS may have an insulating property. For example, the base substrate BS may include a resin substrate or a glass substrate.

The pixel layer PXL may be disposed on the base substrate BS. The pixel layer PXL may include the pixel PX and a plurality of insulating layers BL, 10, 20, 30 and 40. The insulating layers BL, 10, 20, 30 and 40 may include a base layer BL, a first insulating layer 10, a second insulating layer 20, a third insulating layer 30, and a fourth insulating layer 40. In the present embodiment, the second transistor TR2 (hereinafter, referred to as a thin film transistor) and the light emitting element OLD which are some of the components of the pixel PX of FIG. 1D are illustrated as an example.

The thin film transistor TR2 may be disposed on the base substrate BS. The thin film transistor TR2 may include a semiconductor pattern SP, an input electrode IE, an output electrode OE, and a control electrode CE. In the present embodiment, the base layer BL may be disposed between the semiconductor pattern SP and the base substrate BS. The base layer BL may include a single insulating layer or a plurality of insulating layers. For example, the base layer BL may include at least one selected from of a buffer layer and a barrier layer. Thus, the thin film transistor TR2 may be stably formed on the base substrate BS, and permeation of oxygen or moisture provided through the base substrate BS into the pixel PX may be prevented or reduced by the base layer BL.

The control electrode CE may be spaced apart from the semiconductor pattern SP with the first insulating layer 10 interposed therebetween. The input electrode IE and the output electrode OE may be spaced apart from the control electrode CE with the second insulating layer 20 interposed therebetween. The input electrode IE and the output electrode OE may penetrate the first insulating layer 10 and the second insulating layer 20 so as to be connected to one side portion and another side portion of the semiconductor pattern SP, respectively.

According to other embodiments, in the thin film element TR2, the control electrode CE may be disposed under the semiconductor pattern SP, and/or the input electrode IE and the output electrode OE may be disposed under the semiconductor pattern SP or may be disposed on the same layer as the semiconductor pattern SP so as to be connected directly to the semiconductor pattern SP. The thin film transistor TR2 according to the present disclosure may have any one of various suitable structures and may not be limited to a specific embodiment.

The light emitting element OLD may be disposed on the third insulating layer 30. The light emitting element OLD may include a first electrode E1, an emission layer EL and a second electrode E2, which are sequentially stacked in the third direction D3.

The first electrode E1 may penetrate the third insulating layer 30 so as to be connected to the thin film transistor TR2. In some embodiments, a connection electrode may be additionally disposed between the first electrode E1 and the thin film transistor TR2. In this case, the first electrode E1 may be electrically connected to the thin film transistor TR2 through the connection electrode.

The fourth insulating layer 40 may be disposed on the third insulating layer 30. An opening may be defined in the fourth insulating layer 40. The opening may expose at least a portion of the first electrode E1. The fourth insulating layer 40 may be a pixel defining layer.

The emission layer EL may be disposed on the first electrode E1. The emission layer EL may include a light emitting material. For example, the emission layer EL may include at least one selected from of materials emitting red light, green light and blue light. In an embodiment, the emission layer EL may include a fluorescent material or a phosphorescent material. In certain embodiments, the emission layer EL may include an organic light emitting material or an inorganic light emitting material such as quantum dots. The emission layer EL may emit light in response to a potential difference between the first electrode E1 and the second electrode E2.

The second electrode E2 may be disposed on the emission layer EL. The second electrode E2 may be opposite to the first electrode E1. The second electrode E2 may be connected to the power source terminal VSS of FIG. 1D. The light emitting element OLD may receive the second power source signal through the second electrode E2.

The second electrode E2 may include a transparent conductive material or a semi-transparent conductive material. Thus, light generated from the emission layer EL may easily exit in the third direction D3 through the second electrode E2. However, embodiments of the present disclosure are not limited thereto. In another embodiment, the first electrode E1 may include a transparent or semi-transparent conductive material, and the light emitting element OLD may be driven in a rear surface light emitting type (or kind). In still another embodiment, the light emitting element OLD may be driven in a both surface light emitting type (or kind) in which light exits through a front surface and a rear surface.

In some embodiments, the light emitting element OLD may further include at least one organic layer or at least one inorganic layer disposed between the emission layer EL and the first electrode E1 and/or between the emission layer EL and the second electrode E2. The organic layer or the inorganic layer may control movement of charges flowing from the first electrode E1 and the second electrode E2 into the emission layer EL to improve light efficiency and life span of the light emitting element OLD.

The encapsulation layer TFE may be disposed on the light emitting element OLD to encapsulate the light emitting element OLD. In some embodiments, a capping layer covering the second electrode E2 may be disposed between the second electrode E2 and the encapsulation layer TFE.

The encapsulation layer TFE may include a first inorganic layer IOL1, an organic layer OL and a second inorganic layer IOL2, which are sequentially stacked in the third direction D3. However, embodiments of the present disclosure are not limited thereto. In another embodiment, the encapsulation layer TFE may further include a plurality of inorganic layers and/or a plurality of organic layers.

The first inorganic layer IOL1 may cover the second electrode E2. Permeation of external moisture and/or oxygen into the light emitting element OLD may be prevented or reduced by the first inorganic layer IOL1. For example, the first inorganic layer IOL1 may include silicon nitride, silicon oxide, silicon oxynitride, or a combination thereof. The first inorganic layer IOL1 may be formed by a deposition process.

The organic layer OL may be disposed on the first inorganic layer IOL1 and may be in contact with the first inorganic layer IOL1. The organic layer OL may be planarized on the first inorganic layer IOL1. The organic layer OL may cover a bent portion of a top surface of the first inorganic layer IOL1 and/or a particle existing on the first inorganic layer IOL1, and thus, the influence of the bent portion and/or the particle on components formed on the organic layer OL may be blocked by the organic layer OL. In addition, the organic layer OL may relax or release stress between layers being in contact with the organic layer OL. The organic layer OL may include an organic material and may be formed by a solution process such as a spin coating process, a slit coating process, and/or an inkjet process.

The second inorganic layer IOL2 may be disposed on the organic layer OL to cover the organic layer OL. The second inorganic layer IOL2 may be stably formed on a top surface of the organic layer OL, which is relatively flat as compared with the top surface of the first inorganic layer IOL1. The second inorganic layer IOL2 may encapsulate moisture outputted from the organic layer OL such that the escape of moisture to the outside may be prevented or reduced. For example, the second inorganic layer IOL2 may include silicon nitride, silicon oxide, silicon oxynitride, or a combination thereof. The second inorganic layer IOL2 may be formed by a deposition process.

In some embodiments, the encapsulation layer TFE may include a glass substrate. In this case, the encapsulation layer TFE may be coupled to the base substrate BS by a frit seal. In certain embodiments, the encapsulation layer TFE may have at least one of other various suitable shapes encapsulating the light emitting element OLD.

In some embodiments, an input sensing unit including a plurality of sensor patterns may be disposed on the encapsulation layer TFE. In this case, the optical member OPL and an adhesive layer ADL may be disposed on the input sensing unit.

The optical member OPL may be disposed on the display panel DP. In some embodiments, the electronic apparatus DD according to an embodiment of the present disclosure may further include an adhesive layer ADL. The adhesive layer ADL may be disposed between the display panel DP and the optical member OPL to physically couple the optical member OPL to the display panel DP. For example, the adhesive layer ADL may include an optical clear adhesive (OCA), an optical clear resin (OCR), or a pressure sensitive adhesive (PSA).

In the present embodiment, the peripheral area PA may be exposed from the optical member OPL and the adhesive layer ADL. The optical member OPL and the adhesive layer ADL may not cover the vernier mark VM.

In the present embodiment, the area on which the vernier mark VM is disposed may be covered by the insulating layers BL, 10, 20, 30 and 40 and may be exposed from the encapsulation layer TFE. However, embodiments of the present disclosure are not limited thereto. In another embodiment, at least a portion of the encapsulation layer TFE may extend to overlap with the vernier mark VM. Alternatively, at least one selected from the second to fourth insulating layers 20, 30 and 40 may be omitted on the vernier mark VM not to overlap with the vernier mark VM. In certain embodiments, the stack structure on the peripheral area PA may be variously modified.

As the number of the layers covering the vernier mark VM decreases, it may be relatively easy to check the vernier mark VM with the naked eye. As the number of the layers covering the vernier mark VM increases, damage to the vernier mark VM in a process may be prevented or reduced and/or generation of static electricity by an adjacent component may be prevented or reduced. Thus, reliability in the process may be improved. In some embodiments, the vernier mark VM may be disposed at various suitable positions in a range in which it can be checked or identified from the outside for aligning the conductive adhesive member AF and its stability in a process is secured.

In the present embodiment, the line patterns LP of the vernier mark VM may be disposed on the same layer. For example, the uppermost line LP-U and the lowermost line LP-L of the line patterns LP may be disposed on the same layer. Thus, the vernier mark VM may be formed by a single patterning process.

In the present embodiment, the vernier mark VM may be disposed on the same layer as the control electrode CE. Thus, the vernier mark VM may be disposed between the first insulating layer 10 and the second insulating layer 20. The vernier mark VM may be formed of the same material as the control electrode CE. For example, the vernier mark VM may be formed of a conductive material. Thus, the vernier mark VM may be formed concurrently (e.g., simultaneously) with the control electrode CE by using a single mask in a process of forming the control electrode CE. As a result, the vernier mark VM may be formed without an additional process, and thus, manufacturing processes may be simplified and a process cost may be reduced.

In another embodiment, a vernier mark VM-1 may be disposed on the same layer as the input electrode IE and the output electrode OE, as illustrated in FIG. 5A. Thus, the vernier mark VM-1 may be disposed between the second insulating layer 20 and the third insulating layer 30.

In this case, the vernier mark VM-1 may be formed of the same material as the input electrode IE and the output electrode OE. Thus, the vernier mark VM-1 may be formed concurrently (e.g., simultaneously) with the input and output electrodes IE and OE by using a single mask in a process of forming the input and output electrodes IE and OE. As a result, the vernier mark VM-1 may be formed without an additional process, and thus, manufacturing processes may be simplified and a process cost may be reduced.

In still another embodiment, a vernier mark VM-2 may be disposed on the same layer as the first electrode E1, as illustrated in FIG. 5B. Thus, the vernier mark VM-2 may be disposed between the third insulating layer 30 and the fourth insulating layer 40. In this case, the vernier mark VM-2 may be formed of the same material as the first electrode E1. Thus, the vernier mark VM-2 may be formed concurrently (e.g., simultaneously) with the first electrode E1 by using a single mask in a process of forming the first electrode E1. As a result, the vernier mark VM-2 may be formed without an additional process, and thus, manufacturing processes may be simplified and a process cost may be reduced.

In yet another embodiment, a vernier mark VM-3 may be disposed on the same layer as the semiconductor pattern SP, as illustrated in FIG. 5C. Thus, the vernier mark VM-3 may be disposed between the base layer BL and the first insulating layer 10. In this case, the vernier mark VM-3 may be formed of the same material as the semiconductor pattern SP. Thus, the vernier mark VM may be formed concurrently (e.g., simultaneously) with the semiconductor pattern SP by using a single mask in a process of forming the semiconductor pattern SP. As a result, the vernier mark VM-3 may be formed without an additional process, and thus, manufacturing processes may be simplified and a process cost may be reduced.

FIGS. 6A-6D are plan views illustrating portions of electronic apparatuses according to some embodiments of the present disclosure. FIGS. 6A-6D illustrate areas corresponding to the area of FIG. 3 for the purpose of ease and convenience in description. Except for vernier marks VM1, VM2, VM3 and VM4, other components of electronic apparatuses DD1, DD2, DD3 and DD4 of FIGS. 6A-6D may be substantially the same as corresponding components of the electronic apparatus DD of FIG. 3.

Each of the vernier marks VM1, VM2, VM3 and VM4 in FIGS. 6A-6D may have the same transverse length LDD and longitudinal length WD as the vernier mark VM in FIG. 3. However, the vernier marks VM1, VM2, VM3 and VM4 in FIGS. 6A-6D may have different shapes in a plan view. Hereinafter, the same components as in the above embodiments will be indicated by the same reference designators, and the descriptions thereto will be omitted for the purpose of ease and convenience in description.

Figure 6A:
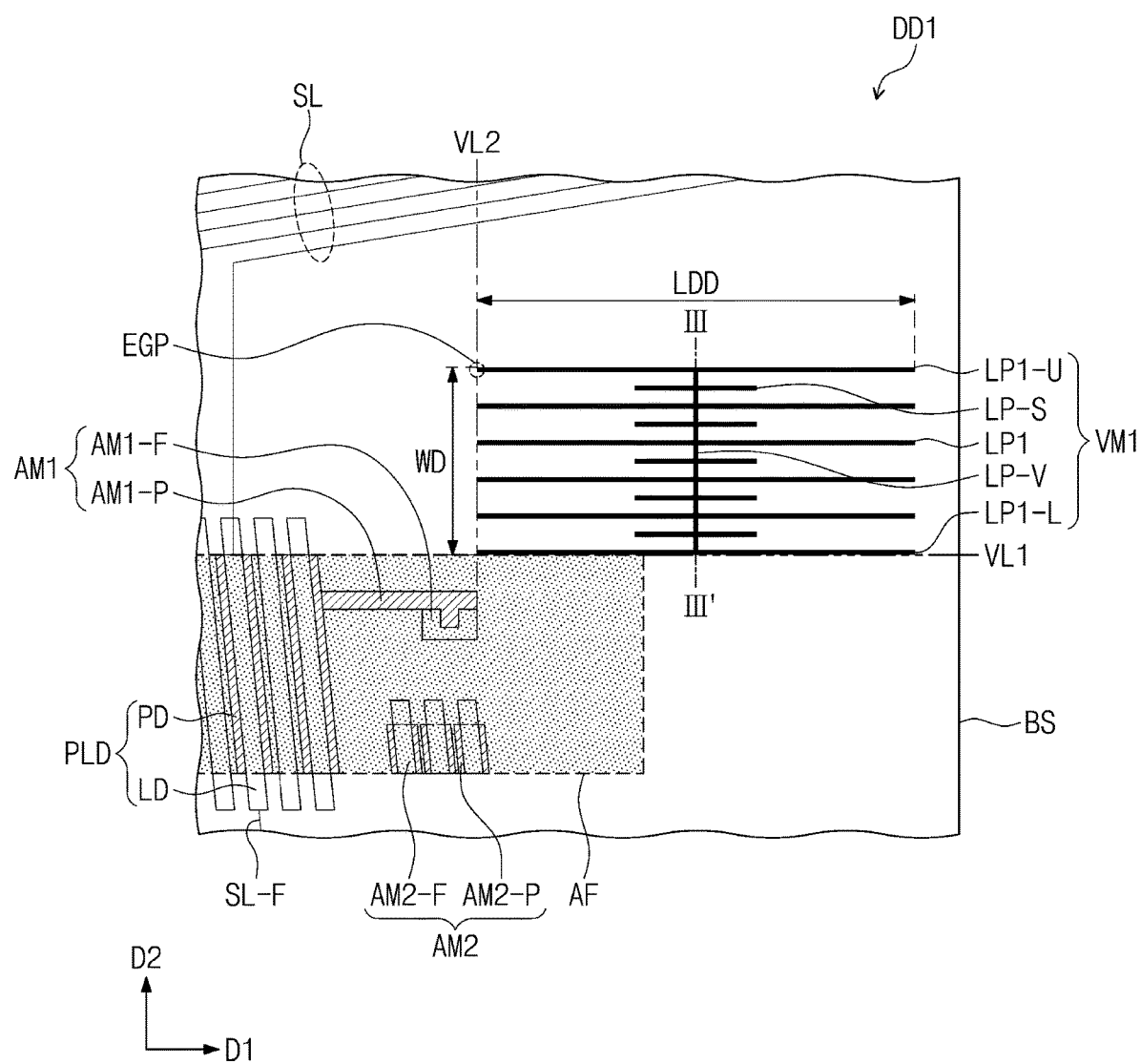
FIGS. 6A-6D are plan views illustrating portions of electronic apparatuses according to some embodiments of the present disclosure.

As illustrated in FIG. 6A, the vernier mark VM1 may include a plurality of line patterns LP1, a plurality of horizontal patterns LP-S, and a vertical pattern LP-V when viewed in a plan view. The line patterns LP1 may include an uppermost line LP1-U and a lowermost line LP1-L when viewed in a plan view. The uppermost line LP1-U and the lowermost line LP1-L may correspond to the uppermost line LP-U and the lowermost line LP-L of FIG. 3, respectively, and thus, duplicative descriptions thereof will not be repeated here.

Each of the horizontal patterns LP-S may have a line shape extending in the first direction D1. A length of each of the horizontal patterns LP-S in the first direction D1 may be less than a length of each of the line patterns LP1 in the first direction D1. In other words, the length of each of the horizontal patterns LP-S in the first direction D1 may be shorter than the transverse length LDD of the vernier mark VM1.

The horizontal patterns LP-S may be spaced apart from each other in the second direction D2 and may be arranged in the second direction D2. The horizontal patterns LP-S may be disposed between the line patterns LP1. The horizontal patterns LP-S and the line patterns LP1 may be alternately arranged in the second direction D2. Because the line patterns LP1 and the horizontal patterns LP-S having the lengths different from those of the line patterns LP1 are alternately arranged, the horizontal patterns LP-S may be easily distinguished from the line patterns LP1. When the conductive adhesive member AF overlaps with the vernier mark VM1, misalignment and a misalignment degree of the conductive adhesive member AF may be easily checked by one(s) of the horizontal patterns LP-S and the line patterns LP1, which overlap(s) with the conductive adhesive member AF.

In some embodiments, the vernier mark VM1 may also include the vertical pattern LP-V. The vertical pattern LP-V may extend in the second direction D2. The vertical pattern LP-V may intersect the line patterns LP1 and the horizontal patterns LP-S and may be connected to the line patterns LP1 and the horizontal patterns LP-S. The vertical pattern LP-V may be disposed at centers of the line patterns LP1. Thus, the vertical pattern LP-V may be disposed at a center of the transverse length LDD of the vernier mark VM1.

Because the vernier mark VM1 further includes the vertical pattern LP-V, an alignment degree of the conductive adhesive member AF in the first direction D1 may be easily checked. As a result, the misalignment degrees of the conductive adhesive member AF in various directions (e.g., the first direction D1 and the second direction D2) may be easily checked, and thus, the conductive adhesive member AF may be accurately aligned.

Figure 6B:
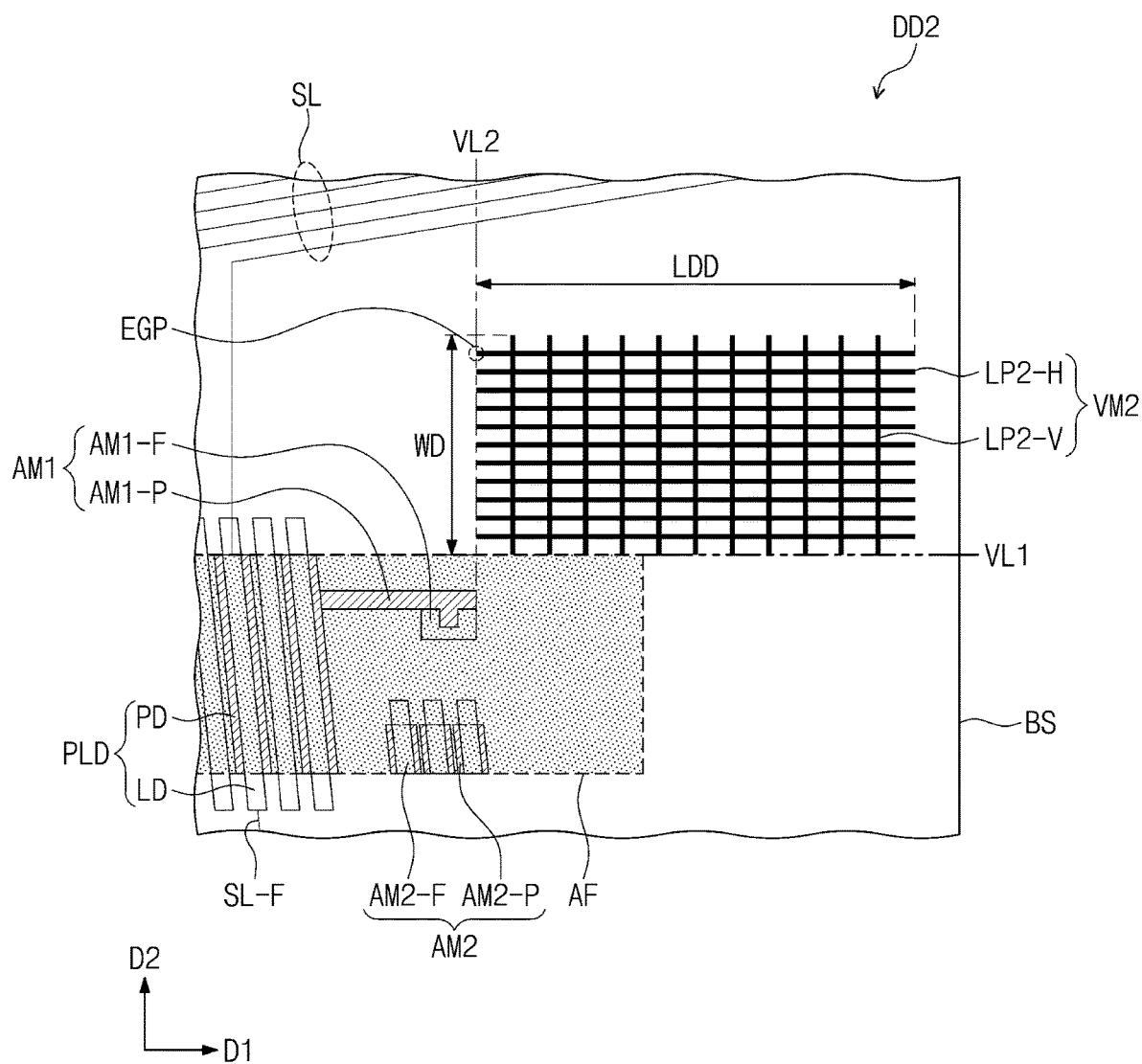

As illustrated in FIG. 6B, the vernier mark VM2 may include a plurality of line patterns LP2-H and a plurality of vertical patterns LP2-V. The line patterns LP2-H may be spaced apart from each other in the second direction D2 and may be arranged in the second direction D2. Each of the line patterns LP2-H may extend in the first direction D1. The vertical patterns LP2-V may be spaced apart from each other in the first direction D1 and may be arranged in the first direction D1. Each of the vertical patterns LP2-V may extend in the second direction D2.

The line patterns LP2-H may intersect the vertical patterns LP2-V when viewed in a plan view. The line patterns LP2-H may be connected to the vertical patterns LP2-V. The vernier mark VM2 may have a substantial mesh shape.

Because the vernier mark VM2 has the mesh shape including the line patterns LP2-H parallel (e.g., substantially parallel) to the first direction D1 and the vertical patterns LP2-V parallel (e.g., substantially parallel) to the second direction D2, the alignment degree of the conductive adhesive member AF may be easily checked in the first direction D1 and the second direction D2. Thus, a position of the conductive adhesive member AF may be easily corrected in the first direction D1 and the second direction D2. As a result, misalignment and misalignment degree of the conductive adhesive member AF may be accurately determined and corrected and may be easily checked with the naked eye through the vernier mark VM2. Thus, reliability in a process may be improved and a process time may be reduced.

Figure 6C:
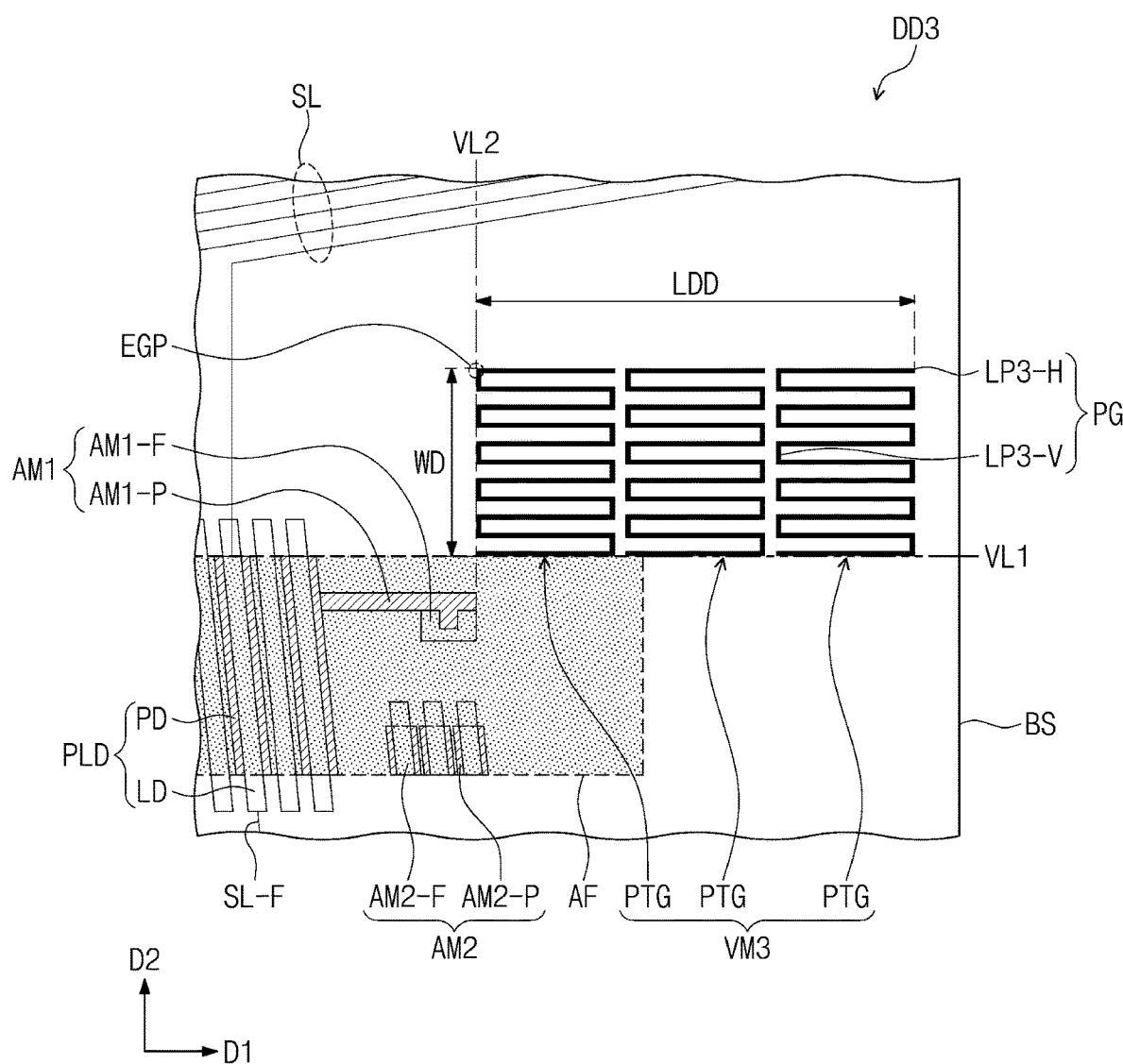

As illustrated in FIG. 6C, the vernier mark VM3 may include a plurality of pattern groups PTG spaced apart from each other in the first direction D1. In the present embodiment, the vernier mark VM3 includes three pattern groups PTG. Each of the pattern groups PTG may include a plurality of line patterns LP3-H and a plurality of vertical patterns LP3-V.

The line patterns LP3-H may extend in the first direction D1 and may be arranged in the second direction D2. Each of the vertical patterns LP3-V may extend in the second direction D2.

Each of the vertical patterns LP3-V may be disposed between two line patterns LP3-H adjacent to each other to connect the two line patterns LP3-H. In addition, the vertical patterns LP3-V may be discontinuously arranged in the second direction D2. In other words, the vertical patterns LP3-V may be arranged in a zigzag form in the second direction D2. Thus, each of the pattern groups PTG may have a bent line shape which extends in the second direction D2 while reciprocating in the first direction D1 and the opposite direction to the first direction D1.

Figure 6D:
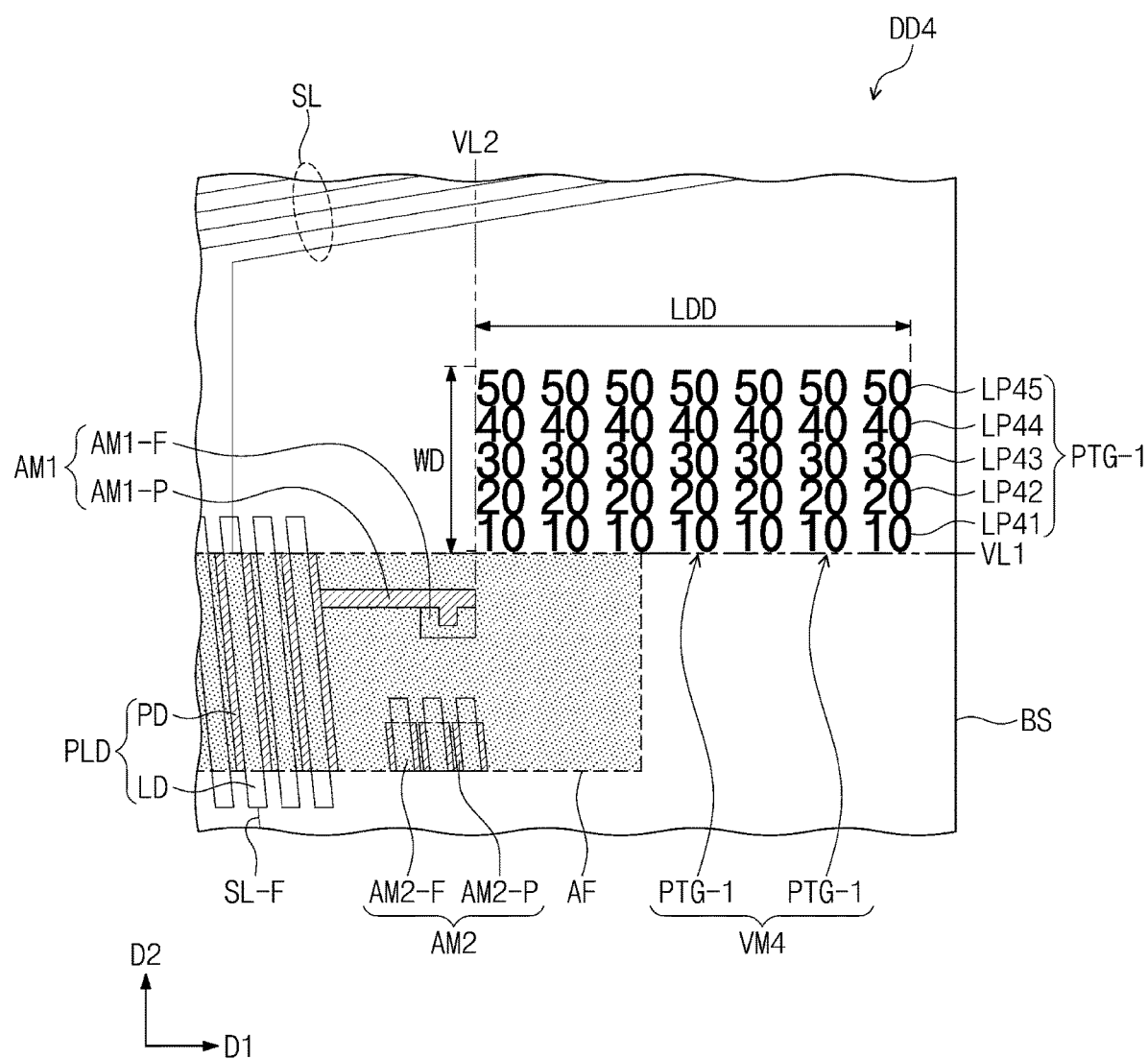

As illustrated in FIG. 6D, the vernier mark VM4 may include a plurality of pattern groups PTG-1 spaced apart from each other in the first direction D1. In the present embodiment, the vernier mark VM4 includes seven pattern groups PTG-1. Each of the pattern groups PTG-1 may include a plurality of patterns LP41, LP42, LP43, LP44 and LP45. Each of the patterns LP41, LP42, LP43, LP44 and LP45 may have an Arabic numeral shape.

For example, the patterns LP41, LP42, LP43, LP44 and LP45 may include a first pattern LP41 having a numeral '10' shape, a second pattern LP42 having a numeral '20' shape, a third pattern LP43 having a numeral '30' shape, a fourth pattern LP44 having a numeral '40' shape, and a fifth pattern LP45 having a numeral '50' shape. The first to fifth patterns LP41, LP42, LP43, LP44 and LP45 may be sequentially arranged in the second direction D2. According to the present embodiment, because the numeral-shaped patterns LP41, LP42, LP43, LP44 and LP45 are used as the vernier mark VM4, the misalignment and the misalignment degree of the conductive adhesive member AF may be easily checked with the naked eye. Thus, the manufacturing processes may be simplified and the process cost may be reduced.

Figure 7B:
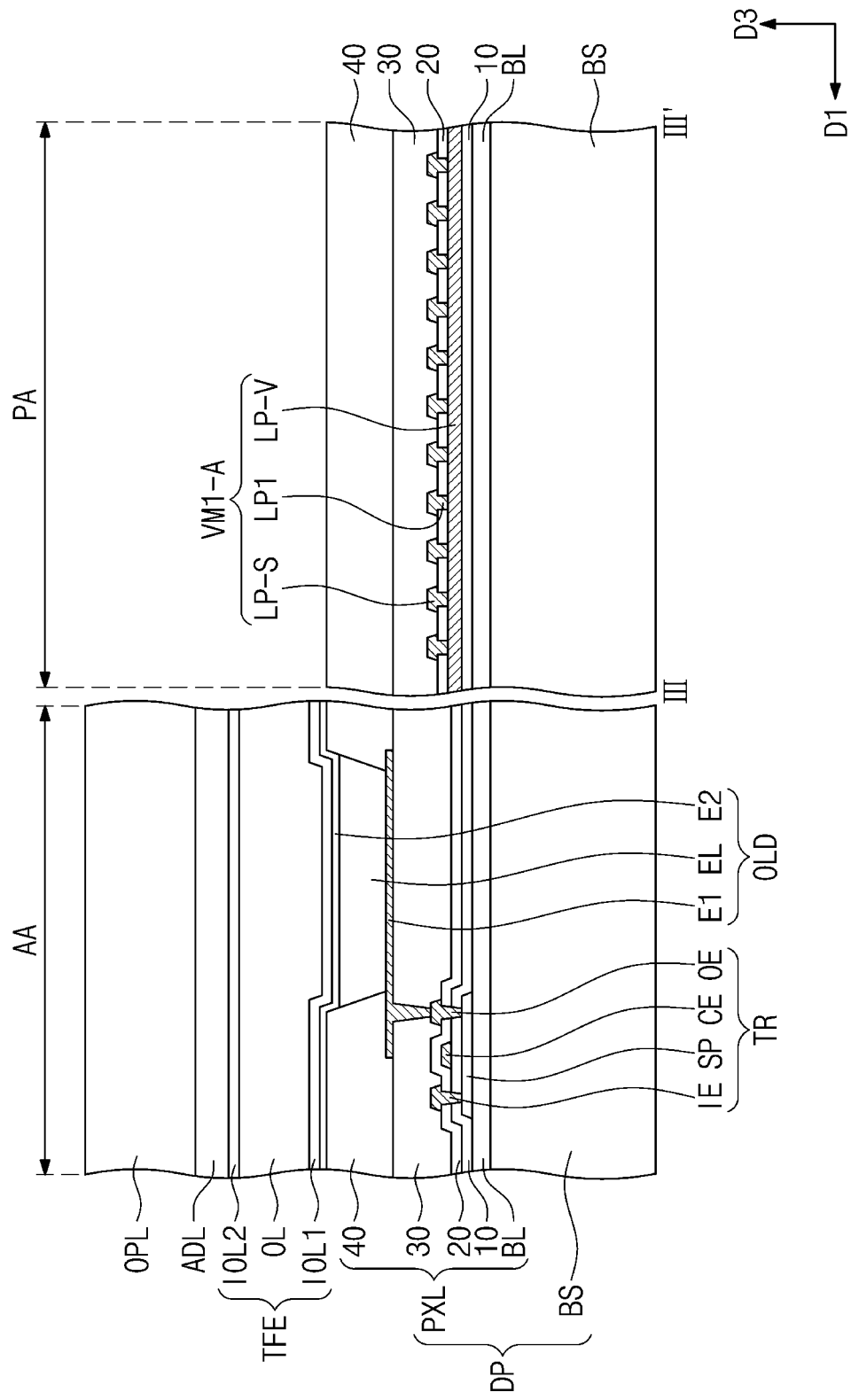

FIGS. 7A-7B are cross-sectional views illustrating portions of electronic apparatuses according to some embodiments of the present disclosure. FIGS. 7A-7B illustrate a portion of the active area AA and an area taken along a line III-III' of FIG. 6A for the purpose of ease and convenience in description. FIGS. 7A-7B illustrate embodiments distinguished from each other. Hereinafter, embodiments of the present disclosure will be described with reference to FIGS. 7A-7B. In addition, the same components as described with reference to FIGS. 1A-6D will be indicated by the same reference designators, and the descriptions thereto will be omitted for the purpose of ease and convenience in description.

As illustrated in FIG. 7A, the vernier mark VM1 may be formed of a single layer. In the present embodiment, the vernier mark VM1 may be disposed between the first insulating layer 10 and the second insulating layer 20. Thus, the line patterns LP1 (see FIG. 6A), the horizontal patterns LP-S (see FIG. 6A) and the vertical pattern LP-V (see FIG. 6A) of the vernier mark VM1 may have a single unitary body shape disposed on the same layer.

Alternatively, as illustrated in FIG. 7B, a vernier mark VM1-A may include stack patterns disposed on different layers from each other. In the present embodiment, the vernier mark VM1-A may include the vertical pattern LP-V disposed between the first insulating layer 10 and the second insulating layer 20, and the line patterns LP1 and the horizontal patterns LP-S disposed between the second and third insulating layers 20 and 30. The line patterns LP1 and the horizontal patterns LP-S may be disposed on the same layer.

The vertical pattern LP-V may be disposed on the layer different from the layer on which the line patterns LP1 and the horizontal patterns LP-S are disposed, and the second insulating layer 20 may be disposed between the vertical pattern LP-V and the line and horizontal patterns LP1 and LP-S. In this case, the line patterns LP1 and the horizontal patterns LP-S may penetrate the second insulating layer 20 so as to be connected to the vertical pattern LP-V. Thus, occurrence of static electricity from parasitic capacitances between the patterns LP1, LP-S and LP-V may be prevented or reduced. As a result, electrical reliability of the electronic apparatus may be improved.

According to embodiments of the present disclosure, the vernier mark VM1 or VM1-A may have at least one of various suitable structures including the single-layered structure and the stack structure.

Figure 8A:
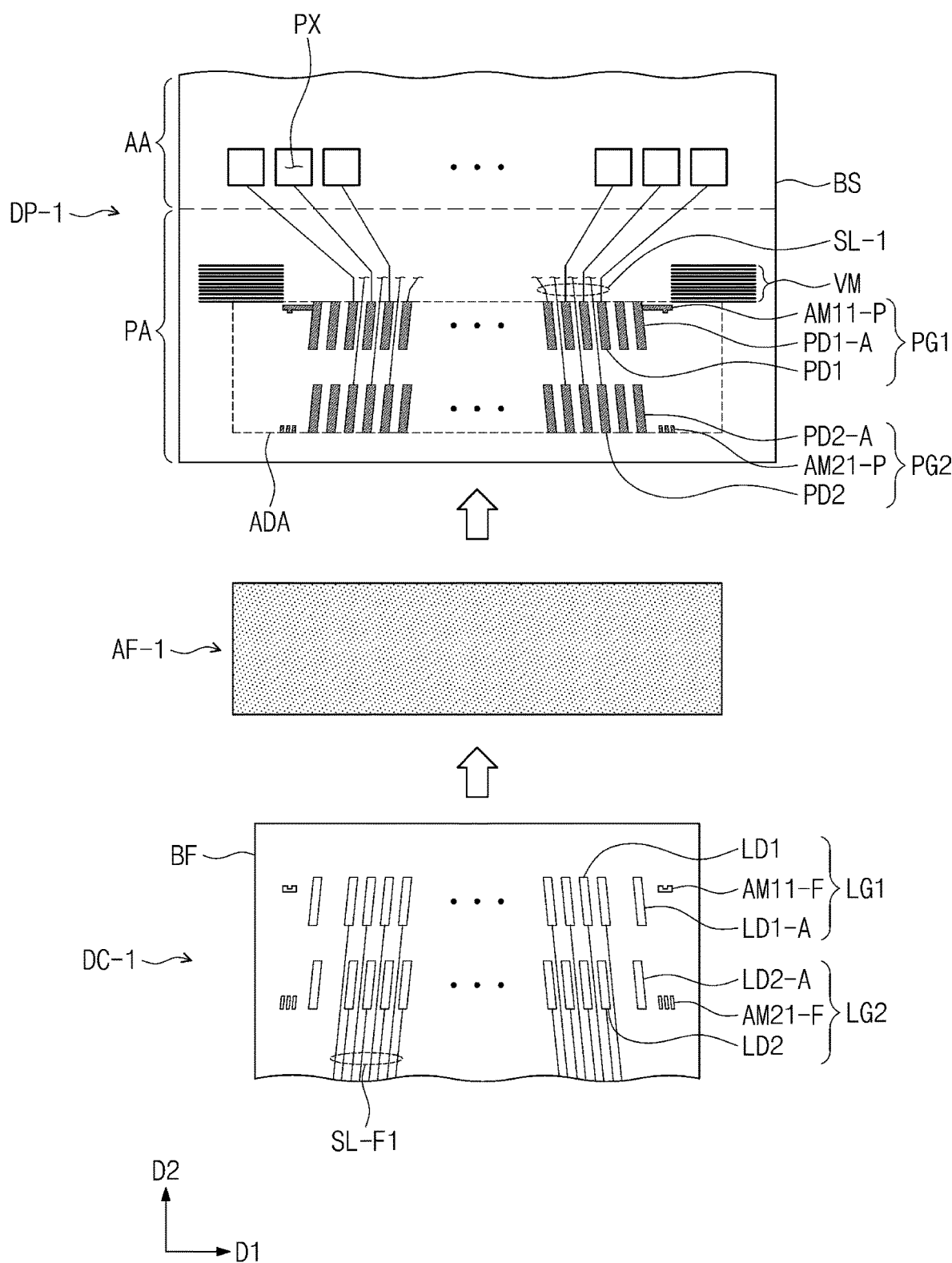
FIG. 8A is an exploded plan view illustrating an electronic apparatus according to an embodiment of the present disclosure.
Figure 8B:
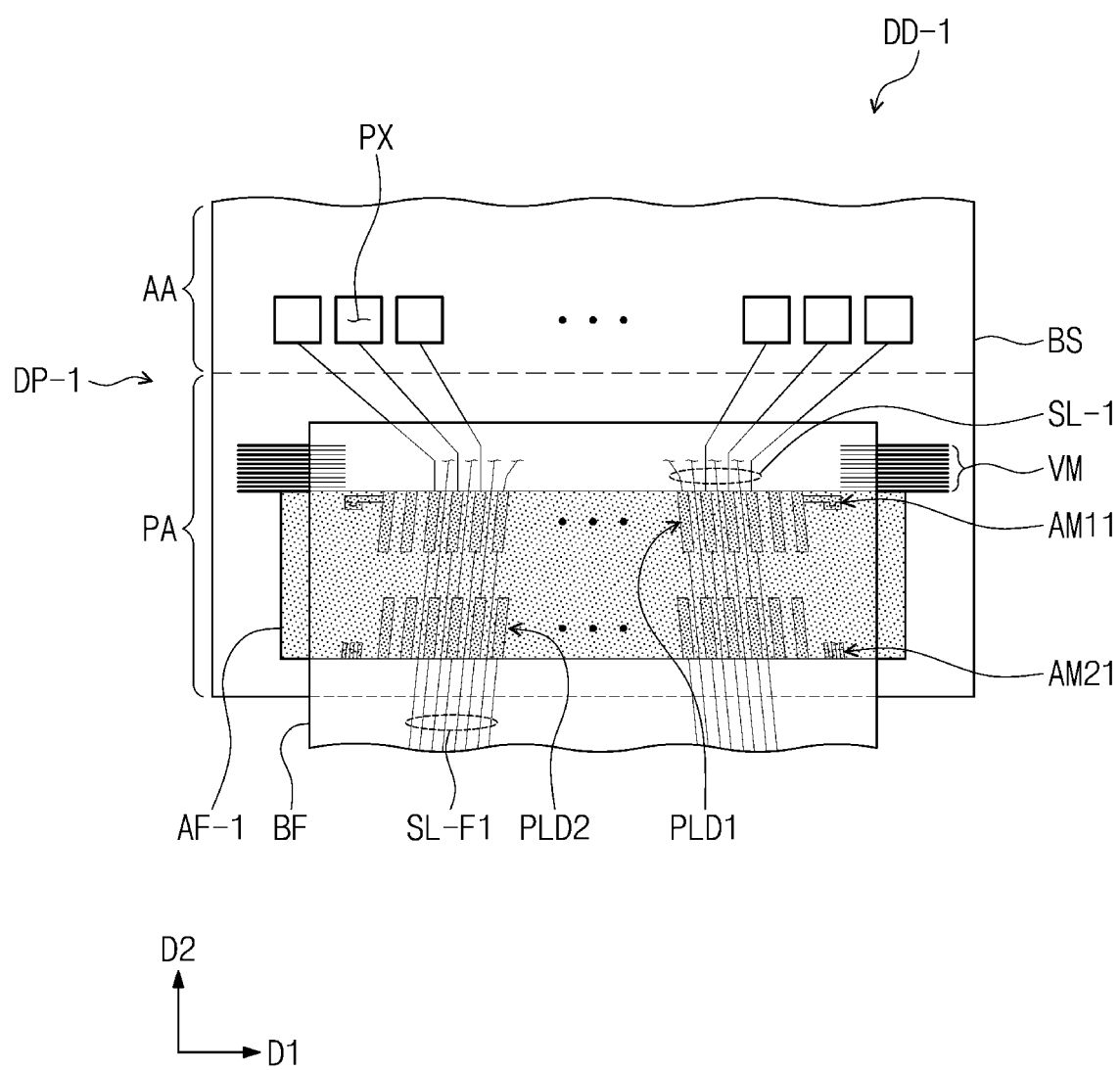
FIG. 8B is a combined plan view illustrating an electronic apparatus according to an embodiment of the present disclosure.

FIG. 8A is an exploded plan view illustrating an electronic apparatus according to an embodiment of the present disclosure, and FIG. 8B is a combined plan view illustrating an electronic apparatus according to an embodiment of the present disclosure. FIGS. 8A-8B illustrate areas corresponding to FIGS. 2A-2B for the purpose of ease and convenience in description. Hereinafter, an embodiment of the present disclosure will be described with reference to FIGS. 8A-8B. In addition, the same components as described with reference to FIGS. 1A-7B will be indicated by the same reference designators, and the descriptions thereto will be omitted for the purpose of ease and convenience in description.

As illustrated in FIGS. 8A-8B, a display panel DP-1 may include a first pad group PG1 and a second pad group PG2 separated from each other in the second direction D2. The first pad group PG1 may include a plurality of first pads PD1 arranged in the first direction D1, a first alignment pad PD1-A spaced apart from the first pads PD1, and a first alignment mark AM11-P. The second pad group PG2 may include a plurality of second pads PD2 arranged in the first direction D1, a second alignment pad PD2-A spaced apart from the second pads PD2, and a second alignment mark AM21-P. The first alignment pad PD1-A, the first alignment mark AM11-P, the second alignment pad PD2-A and the second alignment mark AM21-P may be used as references of alignment of a circuit board DC-1 (e.g., a base film BF), the display panel DP-1, and a conductive adhesive member AF-1. The first alignment pad PD1-A, the second alignment pad PD2-A, the first alignment mark AM11-P and the second alignment mark AM21-P may substantially correspond to the alignment pads PD-A, the first alignment mark AM1-P and the second alignment mark AM2-P of FIG. 2A, and thus, duplicative descriptions thereof will not be repeated here.

Each of the first pad PD1 and the second pad PD2 may be connected to a corresponding one of signal lines SL-1. The first pads PD1 and the second pads PD2 may receive electrical signals independent of each other. For example, the first pads PD1 may be connected to some of the pixels PX, and the second pads PD2 may be connected to the others of the pixels PX. In another embodiment, when the display panel DP-1 includes an input sensing unit, the first pads PD1 may be connected to the pixels PX to provide electrical signals related to image information to the pixels PX, and the second pads PD2 may be connected to the input sensing unit to provide electrical signals related to input sensing to the input sensing unit.

The circuit board DC-1 may include a first lead group LG1 and a second lead group LG2 separated from each other in the second direction D2. The first lead group LG1 may include a plurality of first leads LD1 arranged in the first direction D1, a first alignment lead LD1-A, and a third alignment mark AM11-F. The second lead group LG2 may include a plurality of second leads LD2 arranged in the first direction D1, a second alignment lead LD2-A, and a fourth alignment mark AM21-F. The first pads PD1 and the plurality of first leads LD1 form a first connection pattern PLD1, and the second pads PD2 and the plurality of second leads LD2 form a second connection pattern PLD2. The first alignment lead LD1-A, the second alignment lead LD2-A, the third alignment mark AM11-F and the fourth alignment mark AM21-F may substantially correspond to the alignment leads LD-A, the third alignment mark AM1-F and the fourth alignment mark AM2-F of FIG. 2A, and thus, duplicative descriptions thereof will not be repeated here.

The first leads LD1 and the second leads LD2 may be connected to corresponding ones of interconnection lines SL-F1 disposed on the base film BF to provide electrical signals generated from the driving circuit DV (see FIG. 1A) to the display panel DP-1. The first leads LD1 and the second leads LD2 may be connected to the first pads PD1 and the second pads PD2 corresponding thereto. The first leads LD1 and the second leads LD2 may provide electrical signals independent of each other. The first leads LD1 may provide signals related to an image or signals related to input sensing to the first pads PD1. Likewise, the second leads LD2 may provide signals related to an image or signals related to input sensing to the second pads PD2. The circuit board DC-1 may provide various suitable signals.

The adhesion area ADA may be defined adjacent to the vernier mark VM. The vernier mark VM may include a bottom side (or a bottom end) aligned with top ends of the first pads PD1 when viewed in a plan view. The conductive adhesive member AF-1 may have a size covering at least the first pads PD1 and the second pads PD2. According to embodiments of the present disclosure, even though the first pads PD1 and the second pads PD2 are covered by the base film BF of the circuit board DC-1 and the conductive adhesive member AF-1, an alignment degree of the conductive adhesive member AF-1 may be easily checked through the vernier mark VM. In addition, according to embodiments of the present disclosure, even though the number of the pads increases and an area of the conductive adhesive member AF-1 increases, the alignment degree of the conductive adhesive member AF-1 may be checked in real time in a manufacturing process through the vernier mark VM. Thus, a position of the conductive adhesive member AF-1 may be easily corrected in real time. As a result, the process time may be reduced and the process cost may be reduced.

Figure 9A:
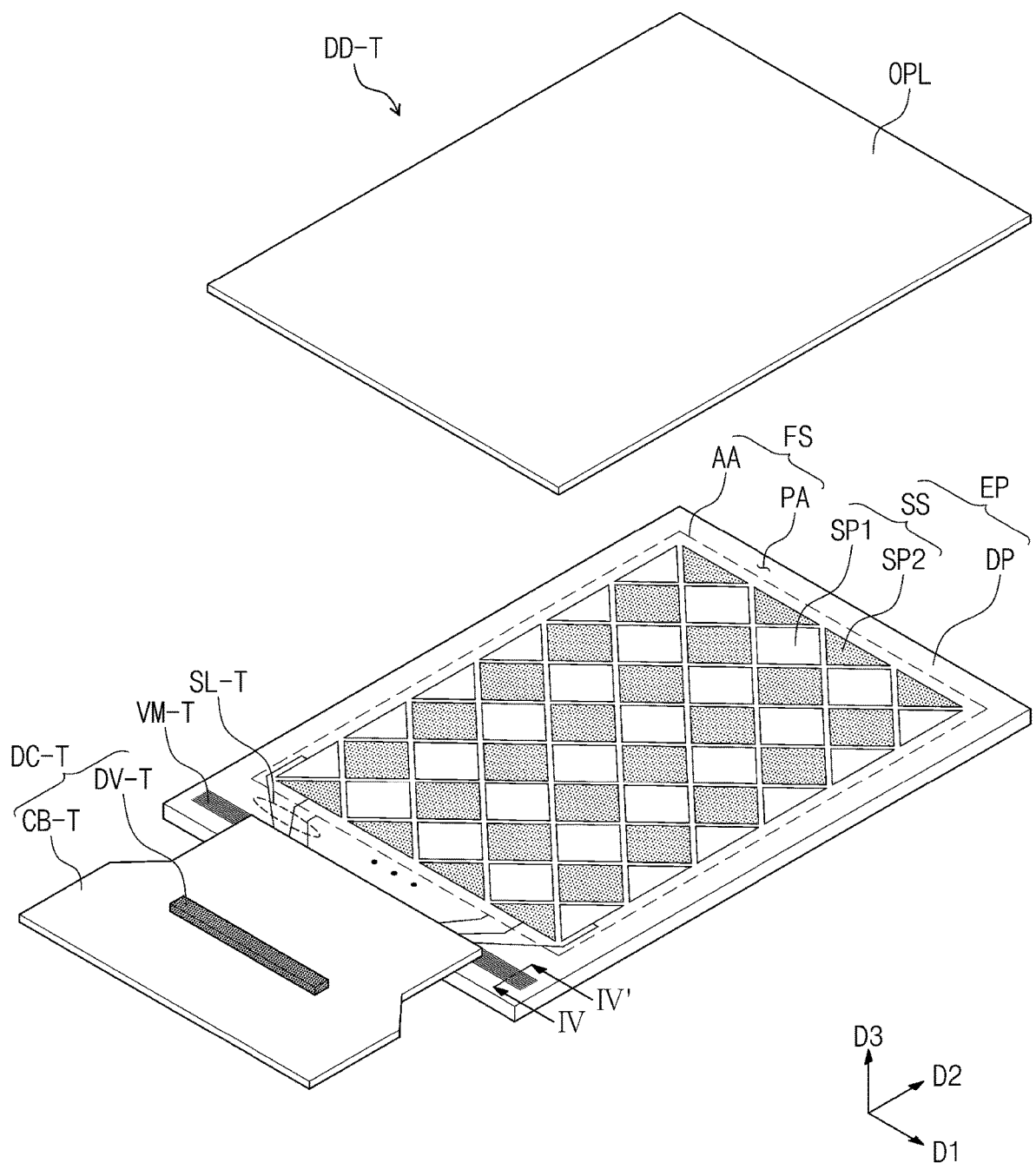
FIG. 9A is an exploded perspective view illustrating an electronic apparatus according to an embodiment of the present disclosure.
Figure 9B:
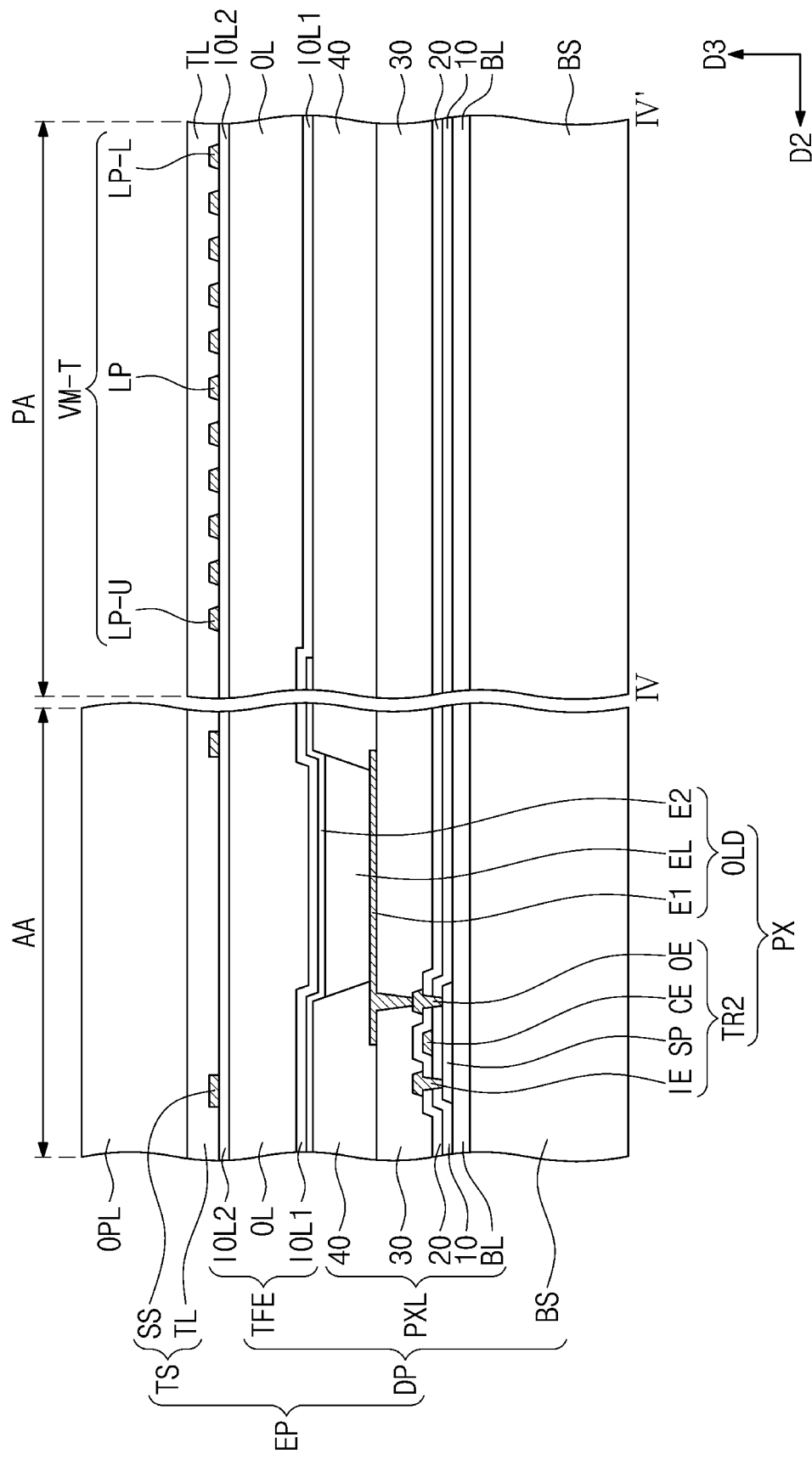
FIGS. 9B-9C are cross-sectional views illustrating embodiments of a portion of the electronic apparatus of FIG. 9A.
Figure 9C:
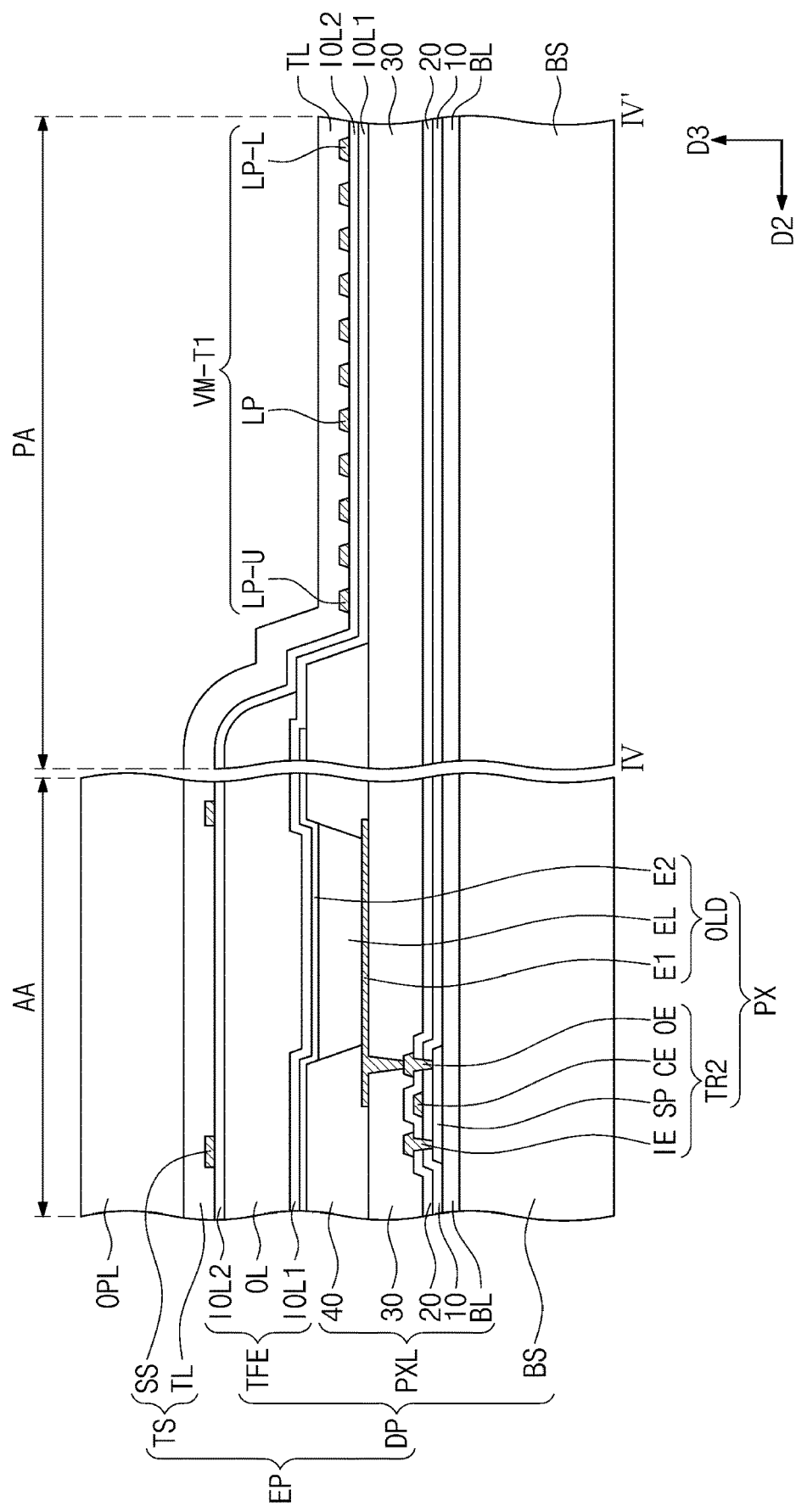

FIG. 9A is an exploded perspective view illustrating an electronic apparatus according to an embodiment of the present disclosure. FIGS. 9B-9C are cross-sectional views illustrating embodiments of a portion of the electronic apparatus of FIG. 9A. FIGS. 9B-9C illustrate both a portion of the active area AA on which the pixel PX is disposed, and a portion of the peripheral area PA on which the vernier mark VM is disposed. Hereinafter, embodiments of the present disclosure will be described with reference to FIGS. 9A-9C. In addition, the same components as described with reference to FIGS. 1A-8B will be indicated by the same reference designators, and the descriptions thereto will be omitted for the purpose of ease and convenience in description.

An electronic apparatus DD-T may include an electronic panel EP, a circuit board DC-T, a conductive adhesive member AF, and an optical member OPL. The electronic panel EP may include a display panel DP and an input sensing unit TS. The display panel DP may include a base substrate BS, a pixel layer PXL, and an encapsulation layer TFE. The base substrate BS, the pixel layer PXL and the encapsulation layer TFE of the active area AA may correspond to the components illustrated in FIG. 4. Hereinafter, duplicated descriptions will be omitted.

The input sensing unit TS may sense an external input. The input sensing unit TS may be formed directly on the encapsulation layer TFE to sense the external input applied to the electronic apparatus DD-T. The external input may include at least one of various suitable types (or kinds) of inputs. For example, the external input according to an embodiment of the present disclosure may include at least one of various suitable external inputs such as a part (e.g., a finger) of the body of a user, light, heat, and pressure. However, embodiments of the present disclosure are not limited thereto. One of other various suitable kinds of display panels may be applied to the electronic apparatus DD-T according to embodiments of the present disclosure.

The input sensing unit TS may include a sensor SS and a cover layer TL. The sensor SS may be disposed on the active area AA. The sensor SS may include a plurality of first sensing electrodes SP1 and a plurality of second sensing electrodes SP2, which receive electrical signals independent of each other.

Each of the first sensing electrodes SP1 may extend in the first direction D1. The first sensing electrodes SP1 may be spaced apart from each other in the second direction D2 and may be arranged in the second direction D2. Each of the second sensing electrodes SP2 may extend in the second direction D2. The second sensing electrodes SP2 may be spaced apart from each other in the first direction D1 and may be arranged in the first direction D1. In FIG. 9A, the second sensing electrodes SP2 are shaded to be distinguished from the first sensing electrodes SP1 for the purpose of ease and convenience in description and illustration.

The sensor SS may sense information on the external input by using a change in capacitance between the first sensing electrodes SP1 and the second sensing electrodes SP2, a change in capacitance of each of the first sensing electrode SP1 and the second sensing electrode SP2 by the external input, or a change in resistance of each of the first sensing electrode SP1 and the second sensing electrode SP2. The sensor SS may sense the external input by various suitable methods, and embodiments of the present disclosure are not limited to a specific embodiment.

Each of the first sensing electrode SP1 and the second sensing electrode SP2 may include a conductive material. For example, each of the first sensing electrode SP1 and the second sensing electrode SP2 may include a transparent conductive material. In an embodiment, each of the first sensing electrode SP1 and the second sensing electrode SP2 may include a plurality of mesh lines defining openings. Each of the openings may overlap with the emission layer EL of each of the pixels PX. Thus, even though the sensor SS is disposed on the active area AA to overlap with the pixels PX of the display panel DP, a phenomenon that visibility of an image displayed by the display panel DP is reduced by the sensor SS may be prevented or reduced. In FIGS. 9B-9C, the sensor SS including the mesh lines is illustrated as an example for the purpose of ease and convenience in description.

The cover layer TL may be disposed on the encapsulation layer TFE to cover the sensor SS. The cover layer TL may have an insulating property. The cover layer TL may be an organic layer or may have a stack structure of an organic layer and an inorganic layer. The cover layer TL may protect the sensor SS.

Signal lines SL-T may be connected to the display panel DP and the input sensing unit TS to provide electrical signals to the display panel DP and the input sensing unit TS. The signal lines SL-T may include at least one selected from the gate line GL (see FIG. 1D), the data line DL (see FIG. 1D), the power line PL (see FIG. 1D), and a plurality of sensing lines connected to the first sensing electrode SP1 and the second sensing electrode SP2. In the present embodiment, some of the sensing lines connected to the sensor SS and some of the signal lines connected to the display panel DP are illustrated as an example of the signal lines SL-T.

The circuit board DC-T may be connected to the electronic panel EP. The circuit board DC-T may include a flexible film CB-T and a driving circuit DV-T which correspond to the flexible film CB and the driving circuit DV of FIG. 1A. The display panel DP and the input sensing unit TS may be driven by the circuit board DC-T. For example, the circuit board DC-T may be electrically connected to the display panel DP to transmit/receive electrical signals related to an image, and the circuit board DC-T may also be electrically connected to the input sensing unit TS to transmit/receive electrical signals related to input sensing. In an embodiment, both the display panel DP and the input sensing unit TS may be controlled by a single circuit board DC-T. However, embodiments of the present disclosure are not limited thereto. In another embodiment, the electronic apparatus DD-T may include a circuit board for driving the display panel DP and an additional circuit board for driving the input sensing unit TS.

In the present embodiment, a vernier mark VM-T may be disposed on the same layer as the sensor SS. In the present embodiment, the vernier mark VM-T may have the same shape as the vernier mark VM of FIG. 3 when viewed in a plan view. Thus, the vernier mark VM-T may include a plurality of line patterns LP extending in the first direction D1 and arranged in the second direction D2. The uppermost line LP-U of the line patterns LP may be closest to the active area AA in a plan view, and the lowermost line LP-L of the line patterns LP may be furthest from the active area AA in a plan view.

For example, the vernier mark VM-T may be disposed on the same layer as the sensor SS, as illustrated in FIG. 9B. At this time, the encapsulation layer TFE and the cover layer TL may extend onto the peripheral area PA. The vernier mark VM-T may be disposed directly on the encapsulation layer TFE and may be covered by the cover layer TL. In another embodiment, the cover layer TL disposed on the vernier mark VM-T may be omitted from the peripheral area PA.

As illustrated in FIG. 9C, a vernier mark VM-T1 may be disposed on the same layer as the sensor SS. The vernier mark VM-T1 may be disposed between the second inorganic layer IOL2 and the cover layer TL. However, layers disposed between the vernier mark VM-T1 and the base substrate BS in FIG. 9C may be different from layers disposed between the vernier mark VM-T and the base substrate BS in FIG. 9B. For example, the organic layer OL and the fourth insulating layer 40 may be omitted between the vernier mark VM-T1 and the base substrate BS. Thus, the second inorganic layer IOL2 on which the vernier mark VM-T1 is disposed may be in contact with the first inorganic layer IOL1 on the peripheral area PA. In the present embodiment, the vernier mark VM-T1 may be provided at a lower level (height) than the sensor SS with respect to the base substrate BS.

According to embodiments of the present disclosure, in the electronic apparatus DD-T including the input sensing unit TS and the display panel DP, the vernier mark VM-T or VM-T1 may be disposed on the same layer as the sensor SS. Thus, the vernier mark VM-T or VM-T1 may be disposed at an uppermost position from the base substrate BS of the peripheral area PA in a thickness direction except an insulating layer (e.g., the cover layer TL). As a result, the vernier mark VM-T or VM-T1 may be easily viewed with the naked eye. The conductive adhesive member AF may be easily aligned by the naked eye through the vernier mark VM-T or VM-T1, and thus, reliability of electrical connection between the circuit board DC-T and the electronic panel EP may be improved and a connecting process may be simplified.

In some embodiments, in an embodiment, the vernier mark VM-T or VM-T1 may include the same material as the sensor SS. Thus, the vernier mark VM-T or VM-T1 and the sensor SS may be patterned at the same time by using a single mask. As a result, the vernier mark VM-T or VM-T1 may be easily formed without an additional process.

FIGS. 10A-10E are perspective views illustrating a method of manufacturing an electronic apparatus, according to an embodiment of the present disclosure. A method of manufacturing the electronic apparatus of FIG. 1C are illustrated in FIGS. 10A-10E for the purpose of ease and convenience in description. Hereinafter, an embodiment of the present disclosure will be described with reference to FIGS. 10A-10E.

Figure 10A:
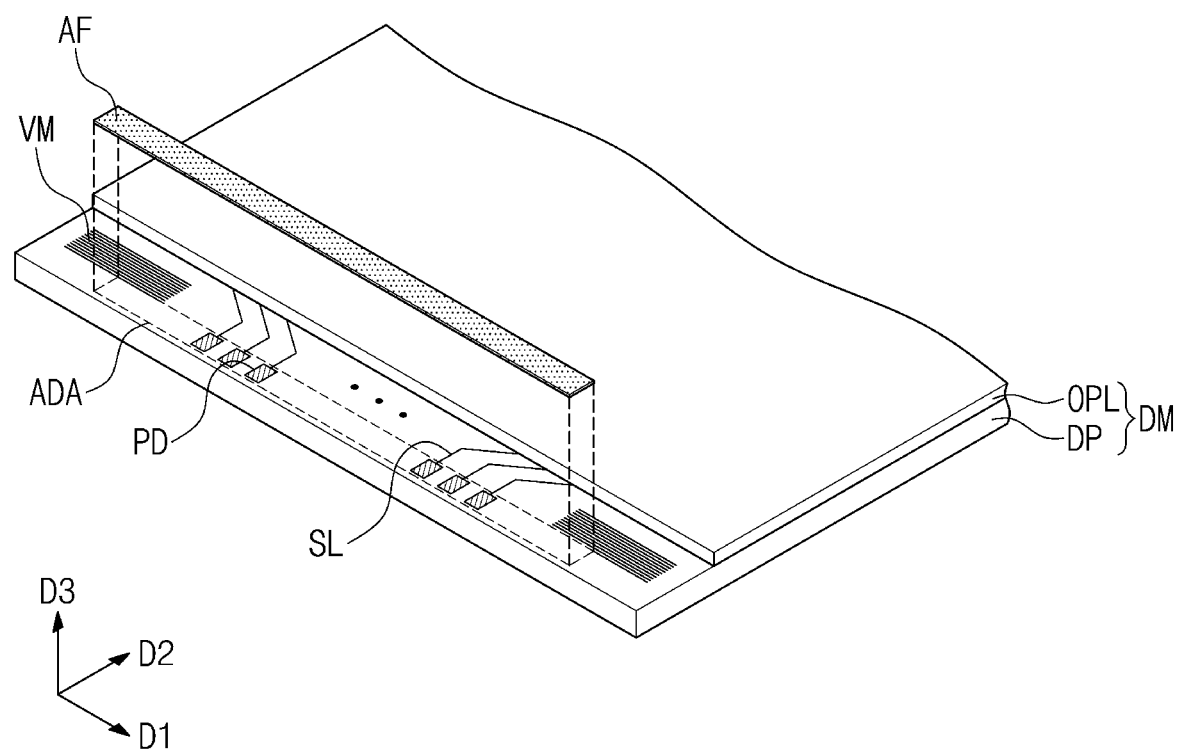
FIGS. 10A-10E are perspective views illustrating a method of manufacturing an electronic apparatus, according to an embodiment of the present disclosure.

Referring to FIG. 10A, the conductive adhesive member AF may be aligned with a display module DM. The display module DM may include the display panel DP and the optical member OPL. The optical member OPL may expose pads PD of the display module DM. The vernier mark VM may exist on an area exposed from the optical member OPL.

The conductive adhesive member AF may be aligned with the adhesion area ADA to cover the pads PD. The adhesion area ADA may be defined adjacent to the vernier mark VM.

Figure 10B:
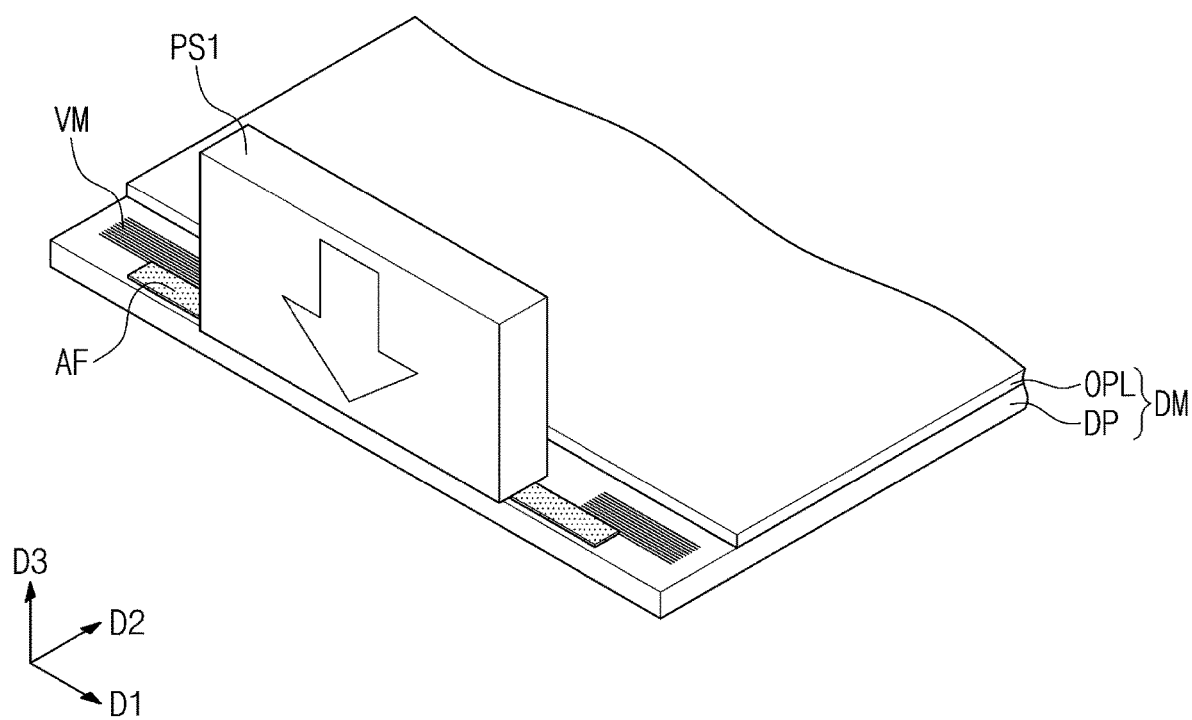
Figure 10C:
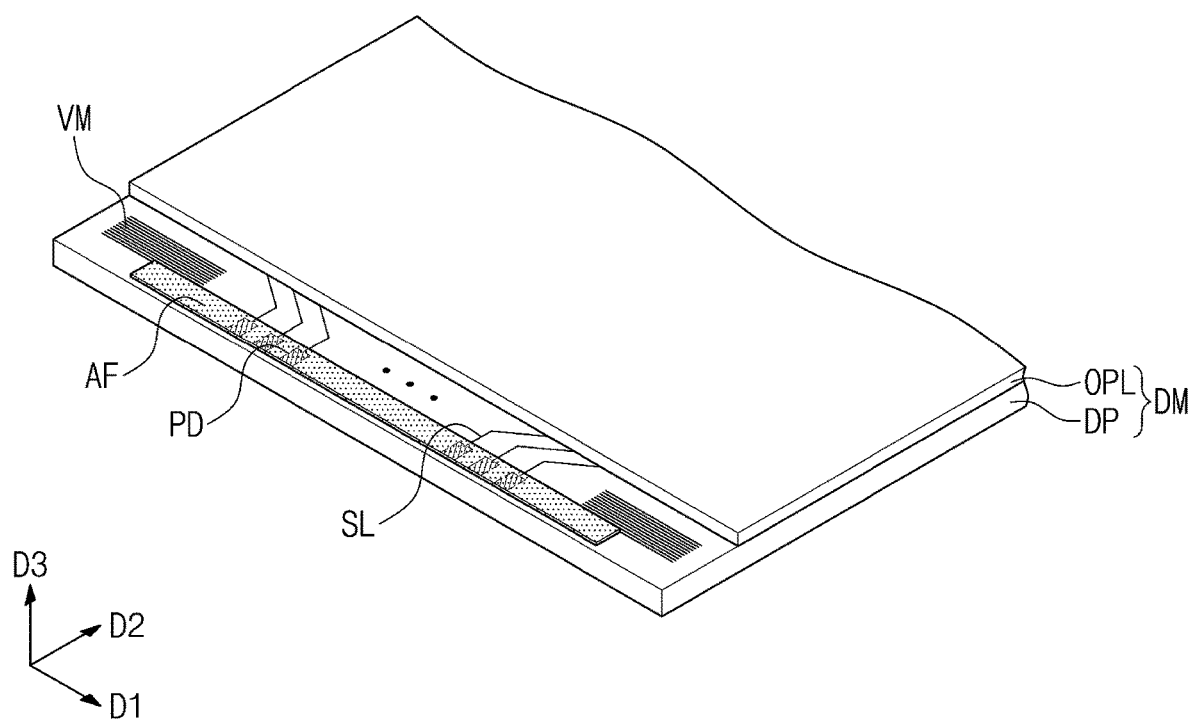

Thereafter, as illustrated in FIGS. 10B-10C, a first bonding process may be performed to adhere the conductive adhesive member AF to the display panel DP. In the first bonding process, the conductive adhesive member AF may be adhered to the adhesion area ADA and then may be pressed by a pressing apparatus PS1. At this time, an alignment degree of the conductive adhesive member AF may be easily checked through an overlapping degree with the vernier mark VM. According to an embodiment of the present disclosure, even though the pads PD are covered by the conductive adhesive member AF, and thus, it is difficult to accurately determine whether the conductive adhesive member AF is aligned with the pads PD, the alignment degree of the conductive adhesive member AF may be easily checked through the overlapping degree between the vernier mark VM and the conductive adhesive member AF.

Figure 10D:
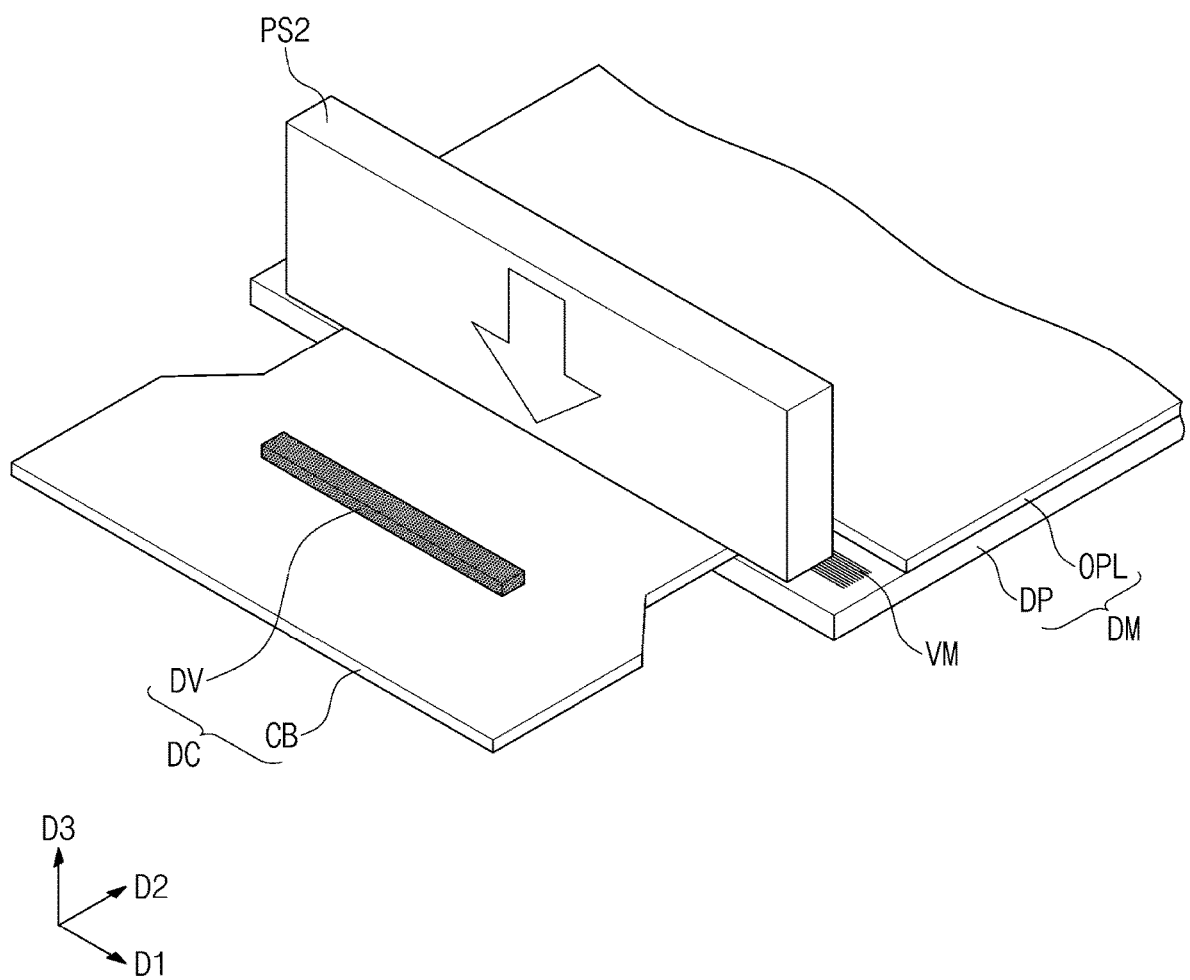
Figure 10E:
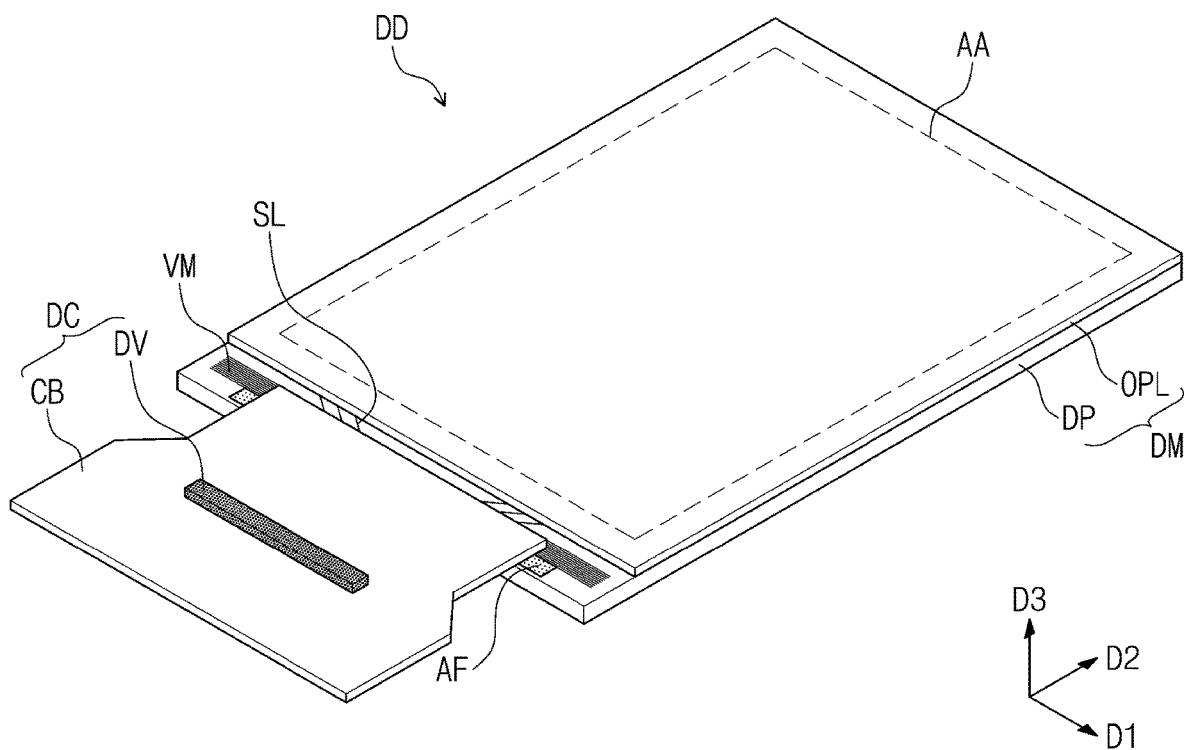

Next, as illustrated in FIGS. 10D-10E, a second bonding process of adhering the circuit board DC to the display panel DP may be performed to manufacture the electronic apparatus DD. In the second bonding process, the circuit board DC may be disposed on the conductive adhesive member AF and then may be pressed by a pressing apparatus PS2. After aligning the circuit board DC on the conductive adhesive member AF, the circuit board DC may be pressed by the pressing apparatus PS2 to enhance bonding strength between the circuit board DC and the conductive adhesive member AF and bonding strength between the display panel DP and the conductive adhesive member AF. At this time, because the alignment degree of the conductive adhesive member AF is checked in real time, alignment accuracy of the circuit board DC may also be improved based on the checked alignment degree of the conductive adhesive member AF. Thus, reliability of the electronic apparatus may be improved in the process of connecting the circuit board DC, and a process time and a process cost may be reduced.

FIGS. 11A-11D are plan views illustrating some processes of a method of manufacturing an electronic apparatus, according to an embodiment of the present disclosure. FIGS. 11A-11D illustrate states corresponding to FIG. 9C for the purpose of ease and convenience in description. Hereinafter, embodiments of the present disclosure will be described with reference to FIGS. 11A-11D.

Figure 11A:
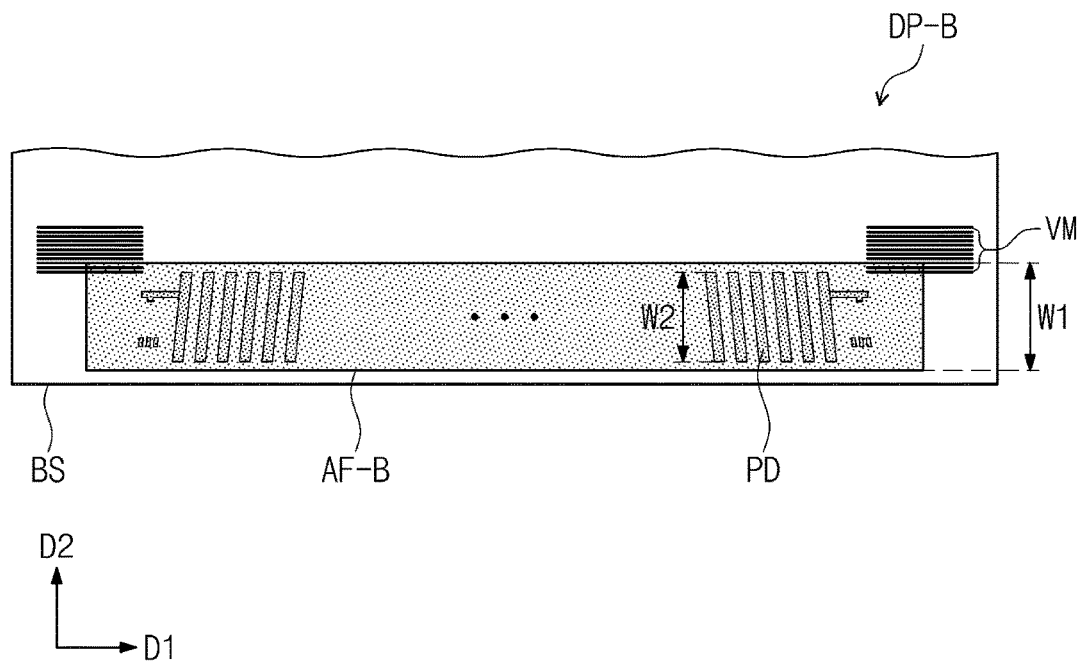
FIGS. 11A-11D are plan views illustrating some processes of a method of manufacturing an electronic apparatus, according to an embodiment of the present disclosure.

As illustrated in FIG. 11A, in a method of manufacturing an electronic apparatus according to an embodiment of the present disclosure, a conductive adhesive member AF-B may be provided to overlap with a portion of the vernier mark VM. At this time, a width W1 of the conductive adhesive member AF-B in the second direction D2 may be greater than a width W2 of the pads PD in the second direction D2. Thus, when the conductive adhesive member AF-B overlaps with a portion of the vernier mark VM, it may be recognized that the conductive adhesive member AF-B is aligned to stably cover the pads PD of a display panel DP-B. As a result, the alignment degree of the conductive adhesive member AF-B may be easily checked through an overlapping degree of the vernier mark VM and the conductive adhesive member AF-B.

Figure 11B:
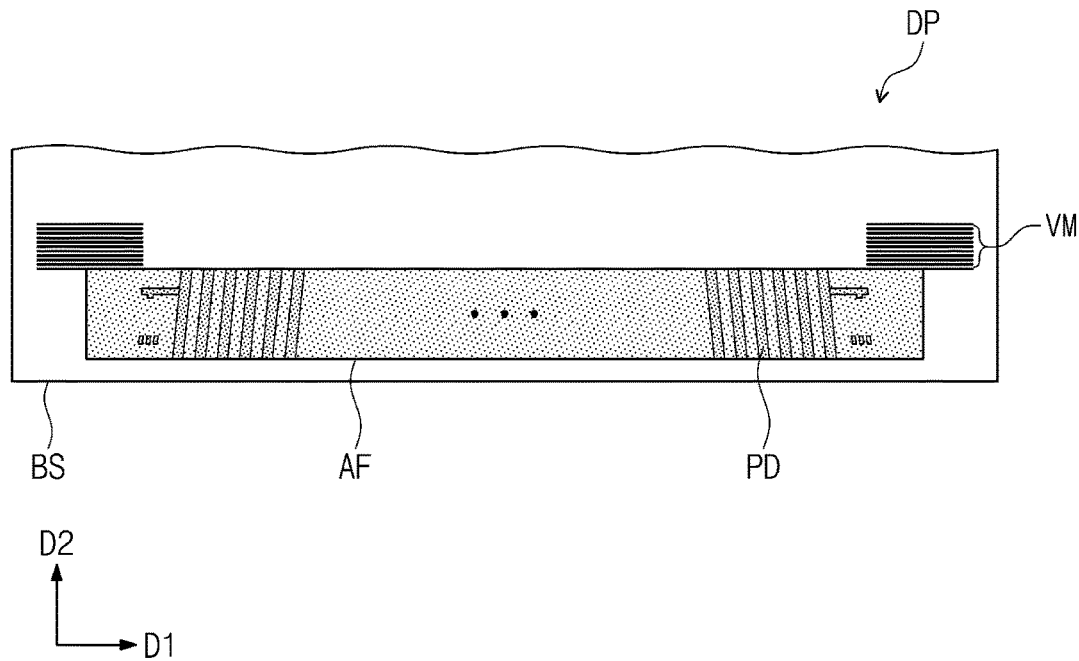
Figure 11C:
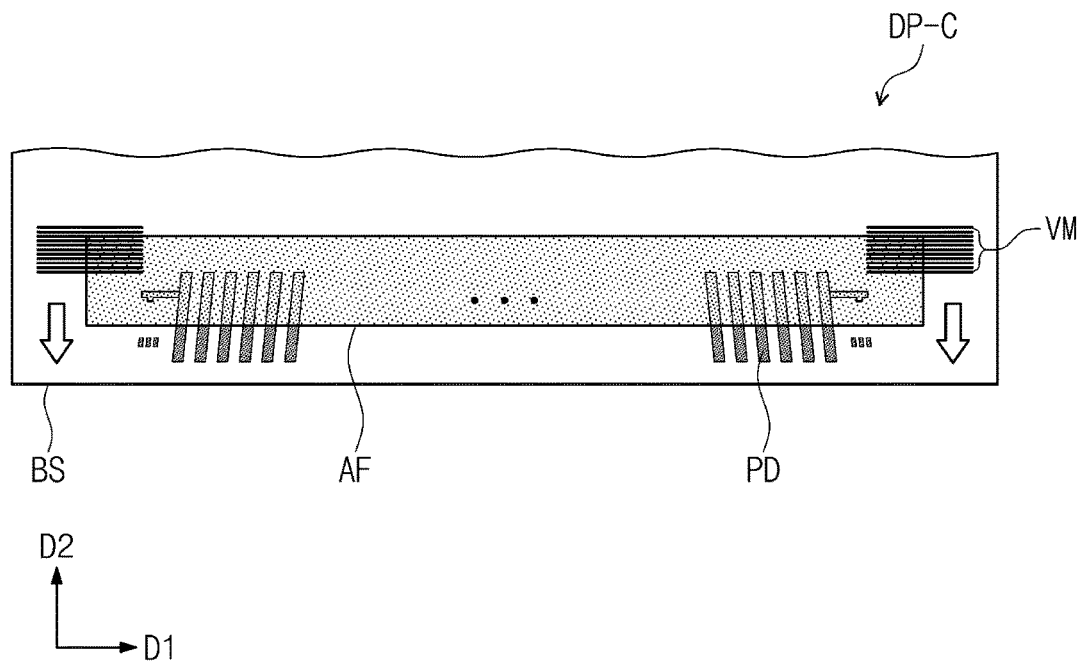
Figure 11D:
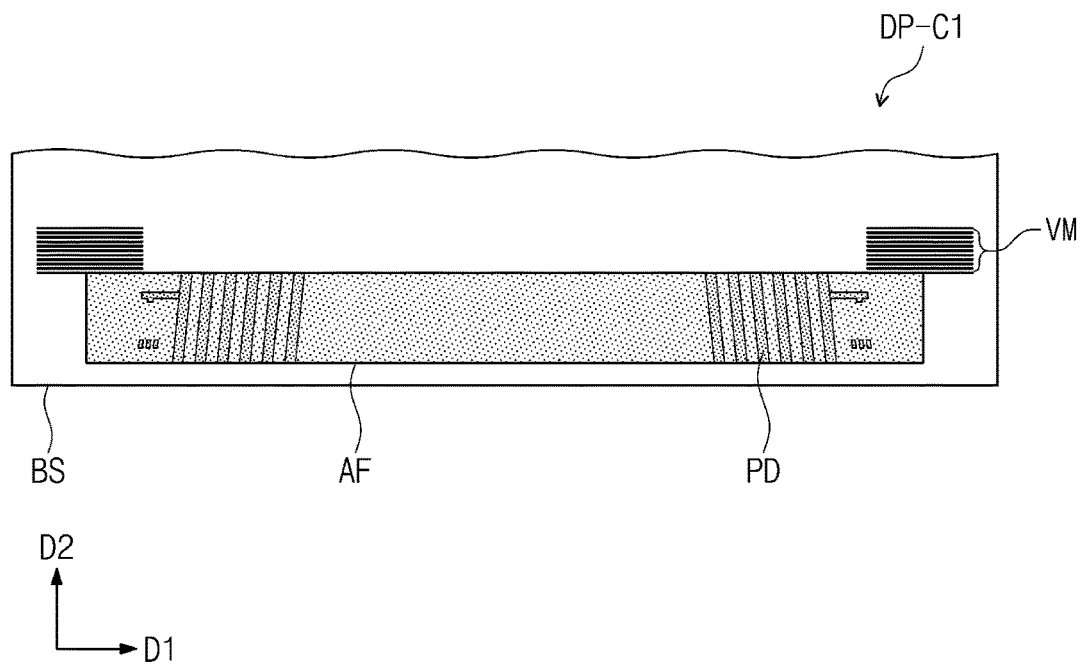

As illustrated in FIGS. 11B-11D, a method of manufacturing an electronic apparatus according to an embodiment of the present disclosure may further include correcting a position of the conductive adhesive member AF. For example, as illustrated in FIG. 11B, when the conductive adhesive member AF is aligned at a position fully covering the pads PD of a display panel DP, the conductive adhesive member AF may meet the vernier mark VM. In other words, in the present embodiment, when the bottom end of the vernier mark VM meets the conductive adhesive member AF, the conductive adhesive member AF may have the greatest overlapping area with the pads PD.

Alternatively, even though initial alignment is performed like FIG. 11B, a misalignment degree may be increased by vibration or repeated misalignments in the process, and thus, the conductive adhesive member AF may be adhered to a display panel DP-C in a state in which an overlapping area between the conductive adhesive member AF and the pads PD is extremely reduced, as illustrated in FIG. 11C. At this time, a majority of the line patterns of the vernier mark VM may overlap with the conductive adhesive member AF. When the line patterns are arranged at equal distances, the misalignment degree of the conductive adhesive member AF may be easily checked by the number of the line patterns overlapping with the conductive adhesive member AF.

Thereafter, as illustrated in FIG. 11D, the conductive adhesive member AF may be aligned with the pads PD of a display panel DP-C1 by moving the conductive adhesive member AF in an arrow direction of FIG. 11C. According to embodiments of the present disclosure, the misalignment and the misalignment degree of the conductive adhesive member AF may be easily checked through the vernier mark VM, and thus, the position of the conductive adhesive member AF may be easily corrected. As a result, the manufacturing processes may be simplified.

Figure 12A:
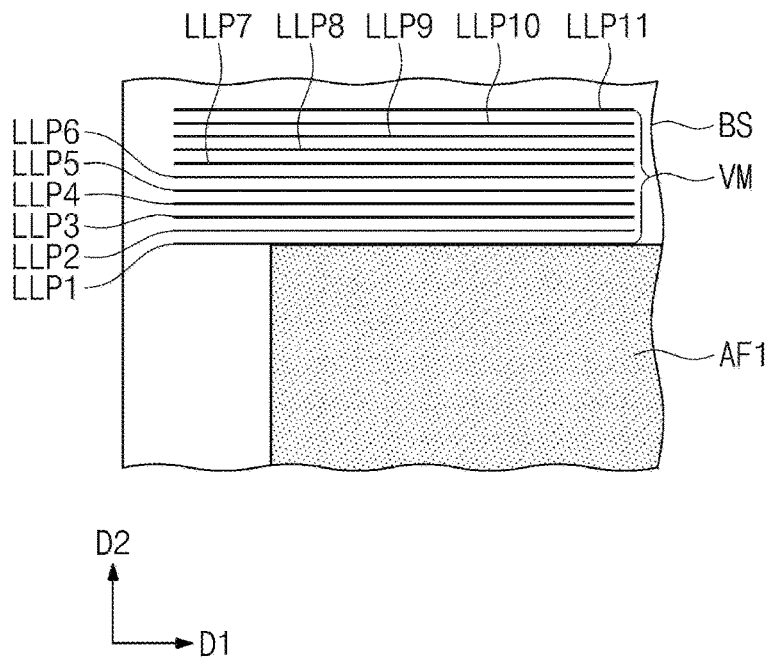
FIGS. 12A-12C are plan views illustrating some processes of a method of manufacturing an electronic apparatus, according to an embodiment of the present disclosure.
Figure 12B:
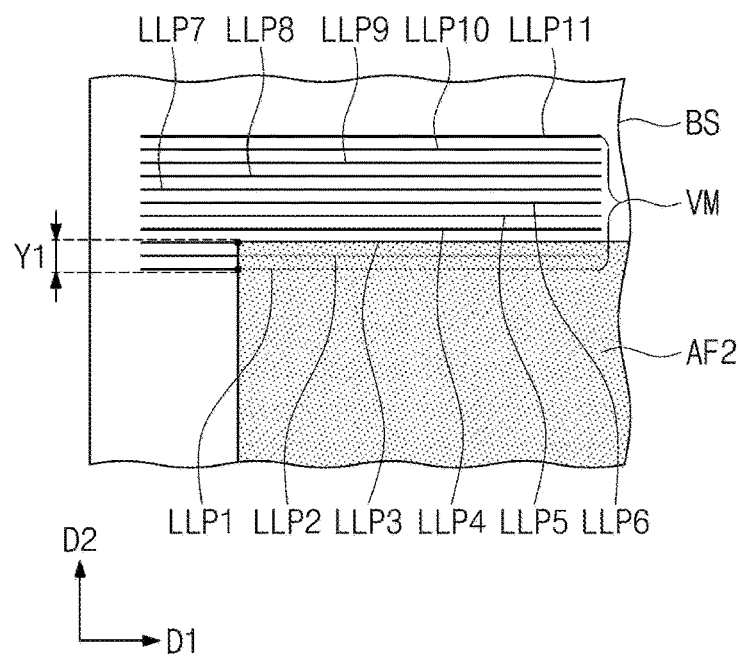
Figure 12C:
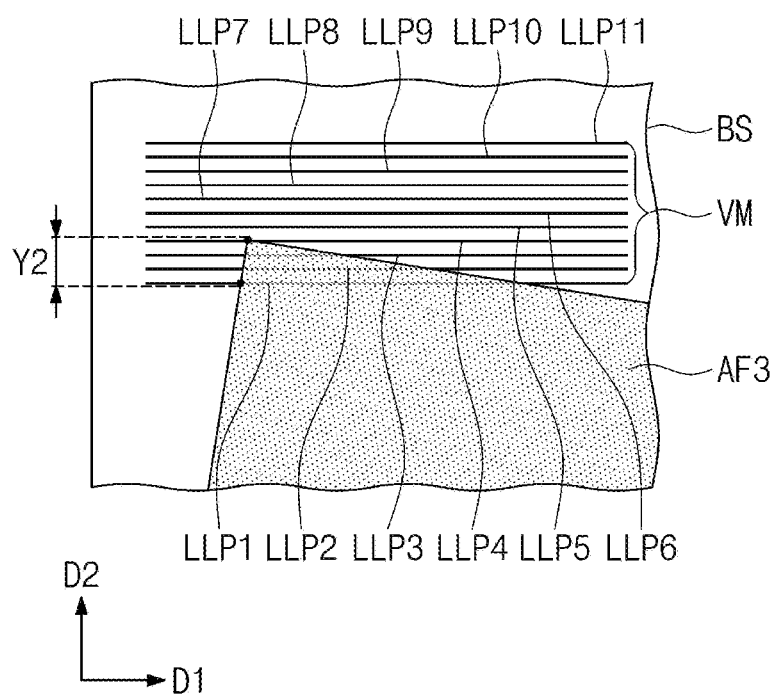

FIGS. 12A-12C are plan views illustrating some processes of a method of manufacturing an electronic apparatus, according to an embodiment of the present disclosure. FIGS. 12A-12C illustrate states corresponding to FIG. 10C for the purpose of ease and convenience in description. Hereinafter, embodiments of the present disclosure will be described with reference to FIGS. 12A-12C.

As illustrated in FIG. 12A, a conductive adhesive member AF1 may be disposed to meet the vernier mark VM. A top end of the conductive adhesive member AF1 may be parallel (e.g., substantially parallel) to a lowermost line LP1 of the vernier mark VM. In the present embodiment, the conductive adhesive member AF1 illustrated in FIG. 12A may be in an aligned state. Thus, the second bonding process of adhering the circuit board DC (see FIG. 10D) to the conductive adhesive member AF1 may be performed without an additional correcting process.

As illustrated in FIG. 12B, a conductive adhesive member AF2 may overlap with a portion of the vernier mark VM. In the present embodiment, the conductive adhesive member AF2 may overlap with a first line pattern LLP1 and a second line pattern LLP2 of a lower portion of the vernier mark VM, and a top end of the conductive adhesive member AF2 may be aligned parallel (e.g., substantially parallel) to a third line pattern LLP3. In FIG. 12B, the conductive adhesive member AF2 does not overlap with a fourth line pattern LLP4, a fifth line pattern LLP5, a sixth line pattern LLP6, a seventh line pattern LLP7, an eighth line pattern LLP8, a ninth line pattern LLP9, a tenth line pattern LLP10, or an eleventh line pattern LLP11. When the conductive adhesive member AF1 of FIG. 12A is in the aligned state, the conductive adhesive member AF2 may be in an misaligned state.

A misalignment degree of the conductive adhesive member AF2 may be determined by the number of the overlapping line patterns and a distance between the line patterns. The misalignment degree of the conductive adhesive member AF2 may be a first distance Y1 in the second direction D2. When the first distance Y1 is in a designed allowable misalignment range, the process of adhering the circuit board DC may be performed without the process of correcting the position of the conductive adhesive member. On the contrary, when the first distance Y1 is beyond the designed allowable misalignment range, the process of correcting the position of the conductive adhesive member AF2 may be performed by moving the conductive adhesive member AF2 in the second direction D2. At this time, a degree of the correction may correspond to the first distance Y1 in the second direction D2.

In some embodiments, as illustrated in FIG. 12C, a conductive adhesive member AF3 may overlap with the vernier mark VM in an inclined state with respect to the vernier mark VM when viewed in a plan view. At this time, the conductive adhesive member AF3 may overlap with three line patterns LLP1, LLP2 and LLP3 of the vernier mark VM, and a top end of the conductive adhesive member AF3 may not be parallel to a fourth line pattern LLP4. According to an embodiment of the present disclosure, the conductive adhesive member AF3 may be moved in the second direction D2 by a second distance Y2 and may be rotated to align the top end of the conductive adhesive member AF3 with the vernier mark VM, and thus, a position of the conductive adhesive member AF3 may be corrected. According to embodiments of the present disclosure, the misalignment degree of the conductive adhesive member may be easily checked through the vernier mark, and thus, the correction of the position of the conductive adhesive member may be performed in real time. As a result, the manufacturing processes may be simplified and the process cost may be reduced.

Figure 13A:
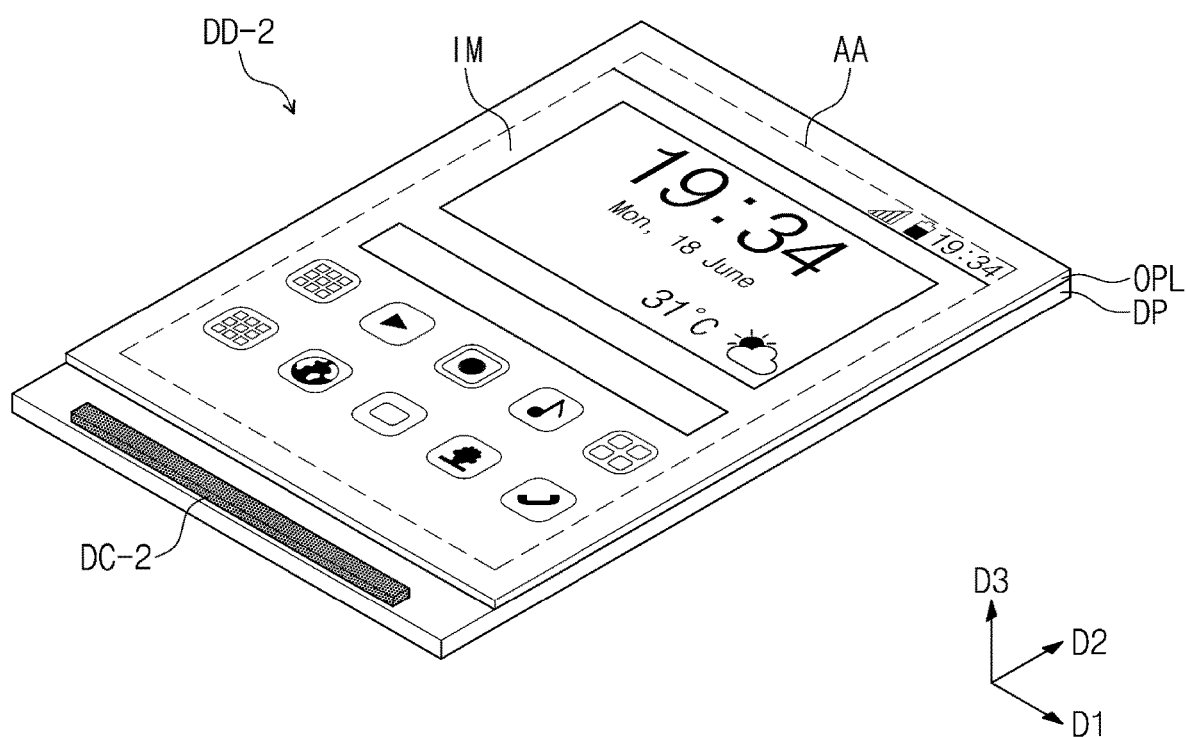
FIG. 13A is a perspective view illustrating an electronic apparatus according to an embodiment of the present disclosure.
Figure 13B:
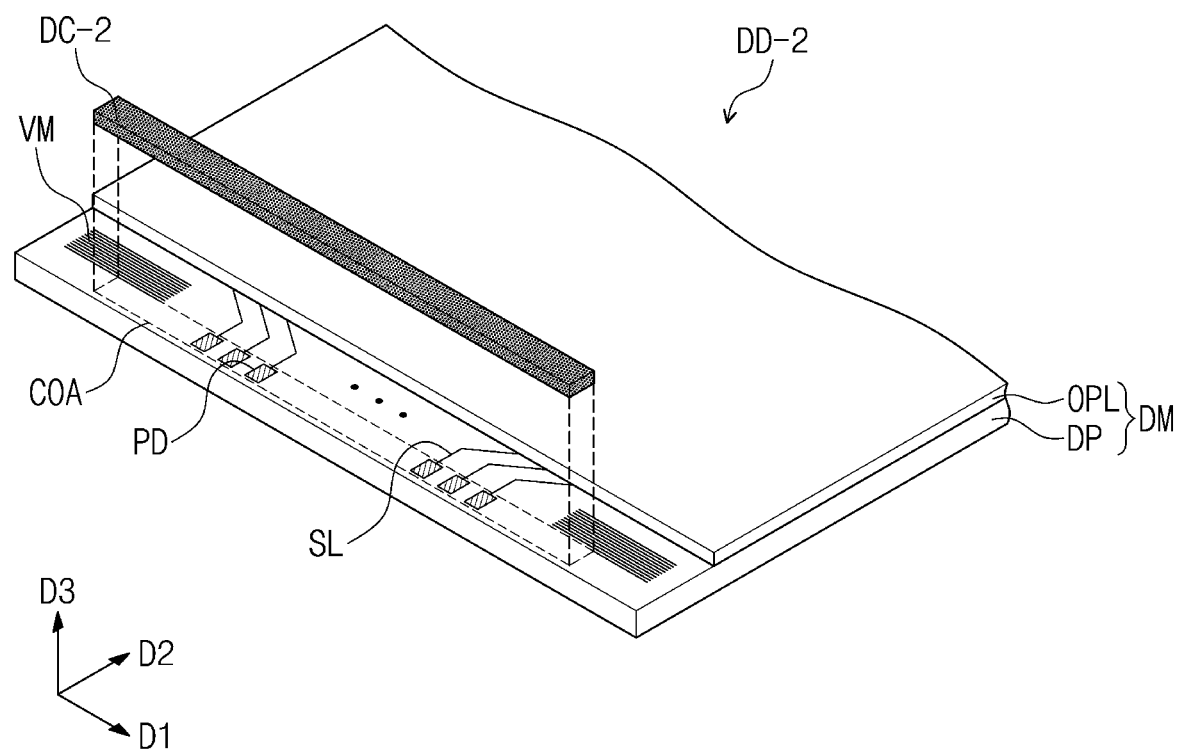
FIG. 13B is an exploded perspective view illustrating a portion of the electronic apparatus of FIG. 13A.
Figure 14A:
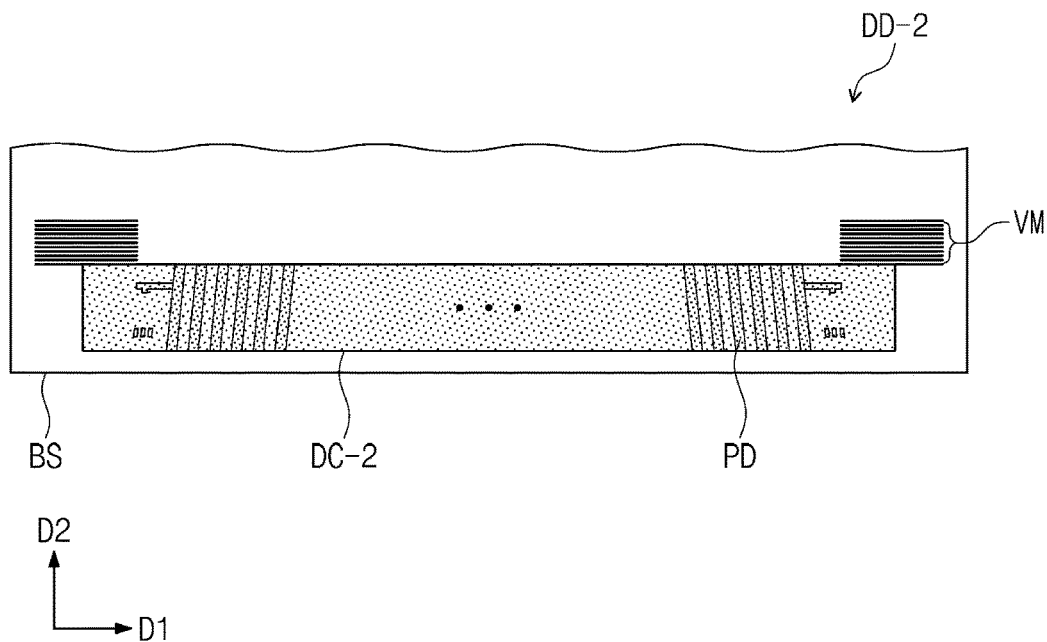
FIG. 14A is a plan view illustrating a portion of the electronic apparatus of FIG. 13A.
Figure 14B:
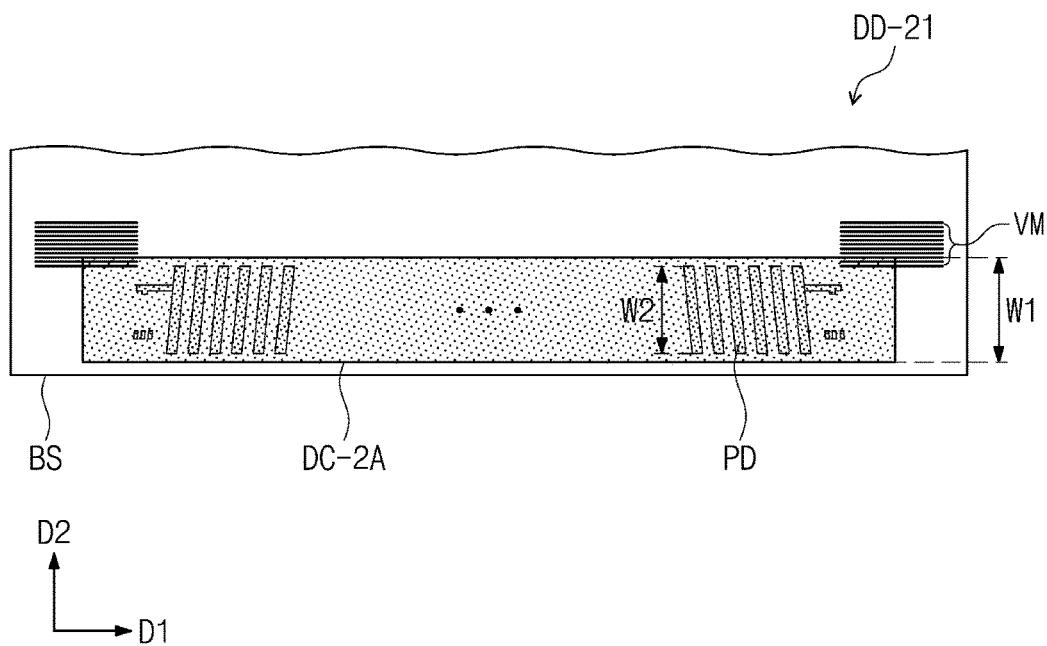
FIG. 14B is a plan view illustrating a portion of an electronic apparatus according to an embodiment of the present disclosure.

FIG. 13A is a perspective view illustrating an electronic apparatus according to an embodiment of the present disclosure. FIG. 13B is an exploded perspective view illustrating a portion of the electronic apparatus of FIG. 13A. FIG. 14A is a plan view illustrating a portion of the electronic apparatus of FIG. 13A. FIG. 14B is a plan view illustrating a portion of an electronic apparatus DD-21 according to an embodiment of the present disclosure. FIG. 14B illustrates an area corresponding to FIG. 14A for the purpose of ease and convenience in description. Hereinafter, embodiments of the present disclosure will be described with reference to FIGS. 13A-14B.

As illustrated in FIG. 13A, an electronic apparatus DD-2 may include a display panel DP, an optical member OPL, and a driving circuit DC-2. The display panel DP and the optical member OPL may correspond to the display panel DP and the optical member OPL, respectively, and thus, duplicative descriptions thereof will not be repeated here.

The driving circuit DC-2 may be mounted on the display panel DP. In more detail, the driving circuit DC-2 may be disposed on the base substrate BS (see FIG. 4) of the display panel DP, on which the signal lines SL are disposed. Referring to FIG. 13B, the driving circuit DC-2 may be disposed to be aligned with a connection area COA of the display panel DP, and thus, the driving circuit DC-2 may be connected to the pads PD of the display panel DP.

The driving circuit DC-2 may include an integrated circuit including a plurality of interconnection lines and at least one driving device connected to the interconnection lines. The driving circuit DC-2 may be provided in the form of a chip and may be connected to the display panel DP through an additional coupling member. The coupling member may include an optical clear adhesive layer, an anisotropic conductive film, a pressure sensitive adhesive layer, or a solder ball.

According to an embodiment of the present disclosure, the driving circuit DC-2 may be aligned with the connection area COA by using the vernier mark VM. The driving circuit DC-2 may be disposed to overlap with the vernier mark when viewed in the second direction D2. In FIGS. 14A-14B, the pads PD are illustrated to be viewed through the driving circuit DC-2 for the purpose of ease and convenience in description.

For example, as illustrated in FIG. 14A, when a width of the driving circuit DC-2 in the second direction D2 is substantially equal to a width of the pads PD in the second direction D2, the driving circuit DC-2 may be aligned on the pads PD in such a way that a top end of the driving circuit DC-2 meets and is parallel (e.g., substantially parallel) to the bottom end of the vernier mark VM in a plan view. In some embodiments, as illustrated in FIG. 14B, when a width W1 of a driving circuit DC-2A in the second direction D2 is greater than a width W2 of the pads PD in the second direction D2, the driving circuit DC-2A may be aligned on the pads PD in such a way that the driving circuit DC-2A overlaps with at least a portion of the vernier mark VM when viewed in a plan view.

According to embodiments of the present disclosure, when the driving circuit DC-2 is mounted directly on the display panel DP, the vernier mark VM may be used in the process of aligning the driving circuit DC-2. According to embodiments of the present disclosure, the driving circuit DC-2 may be aligned with the display panel DP through the vernier mark VM by the naked eye. Thus, the manufacturing processes may be simplified and the process cost may be reduced.

According to embodiments of the present disclosure, the alignment degree between the conductive adhesive member and the pads of the display panel may be checked with the naked eye, and thus, the processes may be simplified and the process time may be reduced. In addition, according to embodiments of the present disclosure, the misalignment degree of the conductive adhesive member may also be easily checked with the naked eye, and thus, the position of the conductive adhesive member may be corrected in real time (e.g., may be corrected concurrently with the positioning of the conductive adhesive member). As a result, the reliability of electrical connection between the circuit board and the display panel may be improved.

While the subject matter of the present disclosure has been described with reference to example embodiments, it will be apparent to those skilled in the art that various changes and modifications may be made without departing from the spirit and scope of the present disclosure. Therefore, it should be understood that the embodiments described herein are not limiting, but illustrative. Thus, the present disclosure is intended to cover various modifications and equivalent arrangements included within the spirit and scope of the appended claims, and equivalents thereof.

What is claimed is:

1. An electronic apparatus comprising:
    a display panel comprising: a base substrate comprising an active area and a peripheral area adjacent to the active area, pixels on the active area, pads on the peripheral area and arranged in a first direction; signal lines connecting the pixels to the pads; and vernier marks on the peripheral area and spaced apart from the pads and the signal lines,
    a circuit board on the display panel and comprising: a base film; and leads on the base film and overlapping with the corresponding pads in a plan view; and
    a conductive adhesive member extending in the first direction and between the display panel and the circuit board to connect the pads to the leads, and
    wherein each of the vernier marks comprises a plurality of patterns spaced apart from each other, a portion of the conductive adhesive member overlaps at least one of the plurality of patterns,
    wherein in a second direction crossing the first direction in the plan view, a width from a lowermost pattern to an uppermost pattern among the plurality of patterns is 100 μm or more and 450 μm or less.

2. The electronic apparatus of claim 1, wherein an upper end of the conductive adhesive member is aligned with any one of the plurality of patterns overlapping the conductive adhesive member in the first direction.

3. The electronic apparatus of claim 1, wherein each of the plurality of patterns has a line shape extending in the first direction and is spaced apart from each other in the second direction.

4. The electronic apparatus of claim 3, wherein in the second direction, each of the plurality of patterns has a width of 1 μm or more and 3 μm or less.

5. The electronic apparatus of claim 3, wherein in the first direction, a separation distance between the adjacent plurality of patterns is 10 μm or more and 50 μm or less.

6. The electronic apparatus of claim 1, wherein each of the vernier marks further comprises horizontal patterns extending in the first direction and having a smaller width than the plurality of patterns in the first direction and disposed between the adjacent plurality of patterns, and vertical patterns extending in the second direction and disposed between the adjacent one of the pattern and the horizontal pattern.

7. The electronic apparatus of claim 1, wherein each of the pixels comprises:
    a thin film transistor comprising a control electrode, a semiconductor pattern, an input electrode, and an output electrode; and
    a light emitting element connected to the thin film transistor and comprising a first electrode, a second electrode, and an emission layer between the first electrode and the second electrode, and
    wherein the plurality of patterns are disposed on the same layer as any one of the control electrode, the semiconductor pattern, the input electrode, the output electrode, and the first electrode.

8. The electronic apparatus of claim 7, wherein the plurality of patterns have the same material as any one of the control electrode, the semiconductor pattern, the input electrode, the output electrode, and the first electrode.

9. The electronic apparatus of claim 1, wherein any one of the plurality of patterns overlaps the conductive adhesive member, and
    an area of a portion of the plurality of patterns that overlaps the conductive adhesive member is smaller than an area of a portion of the plurality of patterns that is spaced apart from the conductive adhesive member.

10. The electronic apparatus of claim 1, wherein a number of the patterns overlapping the conductive adhesive member among the plurality of patterns is less than a number of the patterns non-overlapping the conductive adhesive member among the plurality of patterns.

11. The electronic apparatus of claim 1, wherein the display panel further comprises: a panel alignment mark spaced apart from the pads and overlapping with the conductive adhesive member in the plan view,
wherein the circuit board further comprises: a board alignment mark overlapping with the conductive adhesive member in the plan view and corresponding to the panel alignment mark, and
when viewed in the second direction, wherein one end of each of the plurality of patterns adjacent to the pads is aligned with one end of the panel alignment mark.

12. The electronic apparatus of claim 1, wherein a distance from top ends of the pads to a top end of the conductive adhesive member in the second direction is less than 100 μm.

13. The electronic apparatus of claim 1, wherein at least a portion of the pads are inclined in a first diagonal direction with respect to the first direction and the second direction in the plan view, and the remaining ones of the pads are inclined in a second diagonal direction crossing the first diagonal direction in the plan view.

14. The electronic apparatus of claim 1, wherein the circuit board overlaps a portion of each of the plurality of patterns and exposes another portion of each of the plurality of patterns.

15. The electronic apparatus of claim 1, wherein each of the plurality of patterns extends in the first direction and spaced apart from each other in the second direction,
each of the vernier marks further comprises vertical patterns extending in the second direction and spaced apart from each other in the first direction,
the plurality of patterns and the vertical patterns have a mesh shape when viewed in the plan view.

\* \* \* \* \*